(12) United States Patent
Lee et al.

(10) Patent No.: US 12,471,192 B2
(45) Date of Patent: Nov. 11, 2025

(54) LED CONTROL UNIT, LIGHTING DEVICE HAVING THE SAME, AND OPERATING METHOD THEREOF

(71) Applicant: SAMSUNG ELECTRONICS CO., LTD., Suwon-si (KR)

(72) Inventors: Bongjin Lee, Suwon-si (KR); June Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 46 days.

(21) Appl. No.: 18/236,157

(22) Filed: Aug. 21, 2023

(65) Prior Publication Data

US 2024/0244726 A1 Jul. 18, 2024

(30) Foreign Application Priority Data

Jan. 12, 2023 (KR) .......................... 10-2023-0004823

(51) Int. Cl.
*H05B 45/325* (2020.01)
*H05B 45/20* (2020.01)
*H05B 45/28* (2020.01)
*H05B 45/30* (2020.01)
*H05B 45/37* (2020.01)
*H05B 45/395* (2020.01)

(52) U.S. Cl.
CPC .......... *H05B 45/325* (2020.01); *H05B 45/28* (2020.01); *H05B 45/37* (2020.01); *H05B 45/395* (2020.01)

(58) Field of Classification Search
None
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |

(Continued)

FOREIGN PATENT DOCUMENTS

| | | |
|---|---|---|
| JP | 2022-65810 A | 4/2022 |
| KR | 10-2010-0128923 A | 12/2010 |

(Continued)

*Primary Examiner* — Anh Q Tran
(74) *Attorney, Agent, or Firm* — Sughrue Mion, PLLC

(57) ABSTRACT

A light-emitting diode (LED) control unit includes: a pulse generator configured to generate a pulse signal; a T-filter configured to convert the pulse signal into a triangular wave signal; a first gate driver configured to receive the triangular wave signal and output a first gate control signal; a second gate driver configured to receive the first gate control signal and output a second gate control signal; a first switch configured to turn on a first LED string corresponding to a first color temperature based on the first gate control signal; a second switch configured to turn on a second LED string corresponding to a second color temperature based on the second gate control signal; and a power supply circuit configured to supply a power supply voltage to the pulse generator, the first gate driver, and the second gate driver by stepping down an operating voltage of the LED driver.

19 Claims, 20 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,478,175 B2 | 10/2016 | Lim |
| 10,178,727 B2 | 1/2019 | Wang et al. |
| 10,405,383 B2 | 9/2019 | Van Kaathoven et al. |
| 10,854,149 B2 | 12/2020 | Kim et al. |
| 11,259,377 B2 | 2/2022 | Serra et al. |
| 2013/0020964 A1 | 1/2013 | Nuhfer et al. |
| 2016/0057818 A1* | 2/2016 | Tsai ............... H05B 45/12 315/153 |
| 2017/0171931 A1* | 6/2017 | Seki ............... H05B 45/395 |
| 2019/0234567 A1* | 8/2019 | Lee ............... H05B 45/24 |
| 2022/0240356 A1 | 7/2022 | Lee et al. |
| 2023/0209677 A1* | 6/2023 | Lee ............... H05B 45/325 315/363 |

FOREIGN PATENT DOCUMENTS

| | | |
|---|---|---|
| KR | 10-2012-0114422 A | 10/2012 |
| KR | 10-2018-0109474 A | 10/2018 |

* cited by examiner

LED CONTROL UNIT, LIGHTING DEVICE HAVING THE SAME, AND OPERATING METHOD THEREOF

CROSS-REFERENCE TO RELATED APPLICATION(S)

This application claims priority to Korean Patent Application No. 10-2023-0004823, filed on Jan. 12, 2023 in the Korean Intellectual Property Office, the disclosure of which is incorporated by reference herein in its entirety.

BACKGROUND

The present disclosure relates to a light-emitting diode (LED) control unit, a lighting device including the same, and an operating method thereof.

In general, LEDs have various advantages, such as low power consumption and long lifespans. Accordingly, in recent years, LED lighting devices have been widely used as a backlight source of devices, in automobile headlamps, or in display devices. LED lighting devices emit light having a Correlated Color Temperature (CCT). In various application environments, it is necessary to change the color temperature of light emitted from the LED lighting device according to the surrounding environment or user's request. In order to vary the color temperature of light emitted from the LED lighting device, a variable color temperature device may be implemented by a plurality of LED lighting devices having different color temperatures and a plurality of LED drivers respectively controlling the plurality of LED lighting devices.

SUMMARY

Example embodiments provide an LED control unit controlling color temperature/dimming at low cost, a lighting device including the same, and an operating method thereof.

According to an aspect of an example embodiment, a light-emitting diode (LED) control unit includes: a pulse generator configured to generate a pulse signal: a T-filter configured to convert the pulse signal into a triangular wave signal: a first gate driver configured to receive the triangular wave signal and output a first gate control signal: a second gate driver configured to receive the first gate control signal and output a second gate control signal: a first switch configured to turn on a first LED string corresponding to a first color temperature based on the first gate control signal: a second switch configured to turn on a second LED string corresponding to a second color temperature based on the second gate control signal: and a power supply circuit configured to supply a power supply voltage to the pulse generator, the first gate driver, and the second gate driver by stepping down an operating voltage of the LED driver.

According to an aspect of an example embodiment, a lighting device includes: a light-emitting diode (LED) module configured to receive an operating voltage, and output light of different color temperatures: an LED control unit configured to receive the operating voltage, and control color temperature or dimming of the LED module; and an LED driver configured to receive AC power, and provide the operating voltage to the LED module and the LED control unit.

According to an aspect of an example embodiment, a method of operating a light-emitting diode (LED) control unit, includes: adjusting a pulse width modulation (PWM) duty ratio through control of a selection switch; and controlling a color temperature or a dimming of an LED module according to the PWM duty ratio, wherein the controlling of the color temperature or the dimming includes: turning on a first LED string corresponding to a first color temperature in response to a first gate control signal having the PWM duty ratio, and turning on a second LED string corresponding to a second color temperature lower than the first color temperature in response to a second gate control signal having the PWM duty ratio.

According to an aspect of an example embodiment, a lighting device includes: a light-emitting diode (LED) converter configured to: receive AC power, and output a positive LED voltage, a negative LED voltage, a positive dimming voltage, and a negative dimming voltage: an LED control unit configured to: receive the positive LED voltage, the negative LED voltage, the positive dimming voltage, and the negative dimming voltage, and perform color temperature control and dimming control: and an LED module configured to receive the positive LED voltage from the LED control unit, a first gate control signal turning on a first LED string having a first color temperature, and a second gate control signal turning on a second LED string having a second color temperature.

According to an aspect of an example embodiment, a light-emitting diode (LED) control unit includes: a color temperature controller configured to control a color temperature of an LED module using a power supply voltage: and a voltage generation circuit configured to: receive an LED operating voltage from an LED driver, and generate the power supply voltage, wherein the voltage generation circuit includes: a first regulator configured to receive the LED operating voltage, a second regulator configured to output the power supply voltage by stepping down an output voltage of the first regulator, and a bypass control circuit configured to inactivate the first regulator according to a level of an operating voltage, and bypass the operating voltage to the second regulator.

BRIEF DESCRIPTION OF DRAWINGS

The above and other aspects, features, and advantages will be more clearly understood from the following detailed description, taken in conjunction with the accompanying drawings, in which.

DETAILED DESCRIPTION

Hereinafter, example embodiments will be described with reference to the accompanying drawings.

In general, even if the same current is supplied to a Light Emitting Diode (LED), the luminous flux of light emitted is different according to the color temperature of the LED. For example, the luminous flux of light emitted from LEDs with color temperatures of 2700K, 3000K, 3500K, 4000K and 5000K, respectively, is measured at 101.5%, 103%, 106.1% and 109.1%, respectively, when the light emitted from an LED with a color temperature of 2700K is 100%. Therefore, the luminous flux tends to increase in proportion to the color temperature of the light emitted from the LED. For example, an LED with a color temperature of 5000K generates luminous flux higher by about 9% than an LED with a color temperature of 2700K even when the same current is supplied. In general, an LED having a relatively low color temperature needs to supply more current than an LED having a relatively high color temperature to maintain the same luminous flux. Looking at this from another aspect, an LED with a relatively high color temperature may obtain the same luminous flux even when a smaller current is supplied than an LED with a relatively low color temperature. Even if the amount of current supplied to the LED decreases, the total luminous flux of the LED module may be maintained to be constant.

According to some embodiments, the color temperature and dimming of the LED may be controlled according to the switching control of the LED control unit. In this case, the switching control may be manual control rather than automatic control by a chip (e.g., micro control unit (MCU)). An LED control unit according to an example embodiment may include a power supply unit of a logic integrated circuit (IC), a pulse generator, a T-filter, a gate driving unit, and a switch connected in series to the LED. The LED control unit adjusts the pulse width modulation (PWM) duty ratio by adjusting the constant value of the T-filter. Also, the trigger levels of the Schmitt trigger inverter are adjustable, in some embodiments. c Therefore, the LED control unit may control the color temperature and dimming of the LED module by adjusting the PWM duty ratio.

In an LED control unit according to an example embodiment, a lighting device including the same, and an operating method thereof, color temperature/dimming control of an LED may be performed by using a discrete circuit to replace the MCU function and controlling the PWM duty ratio. Therefore, the lighting device constitutes an inexpensive LED control unit that is easy to supply and demand for parts without an expensive MCU, and may omit a firmware downloading process during mass production.

Figure 1:
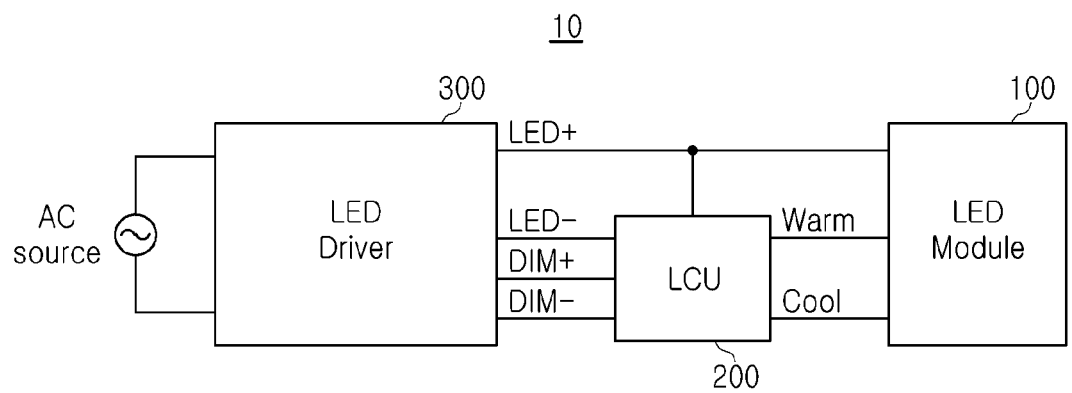
FIG. 1 is a view illustrating a lighting device 10 according to an example embodiment.

FIG. 1 is a view illustrating a lighting device 10 according to an example embodiment. Referring to FIG. 1, the lighting device 10 may include an LED module 100, an LED control unit 200 (LCU), and an LED driver 300.

The LED module 100 may include LEDs connected in series or in parallel. The LED module 10 may include a plurality of LEDs. In this case, the plurality of LEDs may provide at least two LED strings having different color temperatures. For example, the plurality of LEDs may include first LEDs emitting light of a first color temperature and second LEDs emitting light of a second color temperature different from the first color temperature. In this case, the first LEDs may output cool white light, and the second LEDs may output warm white light. The first LEDs may provide at least one first LED string. The second LEDs may provide at least one second LED string. The first LED string and the second LED string may be connected to each other in parallel. On the other hand, it should be understood that the number of LED strings included in the LED module 100 is not suggested as two.

The LED control unit 200 (LCU) may be implemented to control Correlated Color Temperature (CCT) or isolated dimming of the LED module 100. In an example embodiment, the LED control unit 200 may be manufactured in the form of a separate board. In another embodiment, the LED control unit 200 is exposed to the outside of the LED lamp to facilitate user operation, or may be mounted inside the LED driver 300 or on the LED module 100. In an example embodiment, the LED control unit 200 may replace a Micro Control Unit (MCU) function of the related art by being implemented as a circuit with a logic IC, a resistor and a capacitor. In addition, the LED control unit 200 is a constant voltage regulator circuit composed of a Zener diode and a transistor, and may be replaced with a Low Drop Out (LDO) IC. In addition, the LED control unit 200 may be implemented as a simple dimming circuit isolated from the LED color temperature controller.

The LED driver 300 may be implemented to receive AC power and provide DC power (LED+, LED−) to the LED module 100. In addition, the LED driver 300 may be implemented to provide dimming power supplies DIM+ and DIM− to the LED control unit 200.

General lighting devices are implemented in a structure that turns on only Warm LED strings, only Cool LED strings, or both Warm/Cool LED strings according to the selectable color temperature method. There is no problem when only the Warm LED string or the Cool LED string is turned on, but when the Warm/Cool LED strings are turned on simultaneously, the current drift may occur due to the difference in Vf (Forward Voltage) between the Warm/Cool LED strings. When this current drift occurs, it not only deviates from the set color temperature, but also causes overcurrent to flow in a specific LED string, resulting in a high probability of component damage.

On the other hand, the lighting device 10 according to an example embodiment connects to the LED driver 300 and controls the LED to set the Correlated Color Temperature ('CCT') and brightness of the LED module 100. Equipped with a device (200). In an example embodiment, the LED control unit 200 determines the PWM (Pulse Width Modulation) duty ratio of the warm LED string and the cool LED string at a constant frequency of the output current of the LED driver 300 according to the set color temperature.

In addition, the LED control unit 200 may select lighting brightness in stages through a color temperature controller and an isolated dimming circuit. For example, unlike a selectable color temperature setting method, the lighting device 10 of controls the PWM duty ratio with a Warm/Cool LED string, thereby preventing current drift. In addition, the lighting device 10 implements the LED control unit 200 in which expensive MCU functions are replaced with parts that are easy to supply and demand, thereby having advantages in terms of delivery time and price in product manufacturing.

In the lighting device 10a according to an example embodiment, instead of an expensive LED lighting device equipped with Internet of Things (IOT) function, a product may be configured with an LED driver 300, an LED control unit 200 and the LED module 100 having two different color temperatures.

The LED control unit (LCU) illustrated in FIG. 1 may be disposed between the LED driver 200 and the LED module 100 in the form of a separate board, but the embodiments are not limited thereto.

Figure 2:
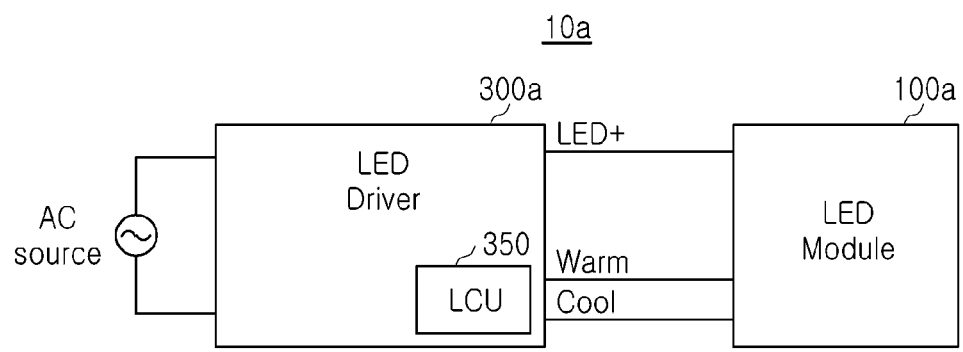
FIG. 2 is a view illustrating a lighting device 10a according to another example embodiment.

FIG. 2 is a view illustrating a lighting device 10a according to another example embodiment. Referring to FIG. 2, the lighting device 10a may include an LED module 100a and an LED driver 300a. The lighting device 10a has an LED control unit 350 (LCU) disposed inside the LED driver 300a compared to that illustrated in FIG. 1. For example, as illustrated in FIG. 2, the LED control unit 350 (LCU) may be mounted on the DC output terminal (Warm/Cool) of the LED driver 300a in the form of a sub-board. As illustrated in FIG. 2, when configuring the LED control unit 350, the brightness selection switch is included in the LED driver 300a, such that dimming terminals (DIM+/DIM−) or wires may be deleted.

Figure 3:
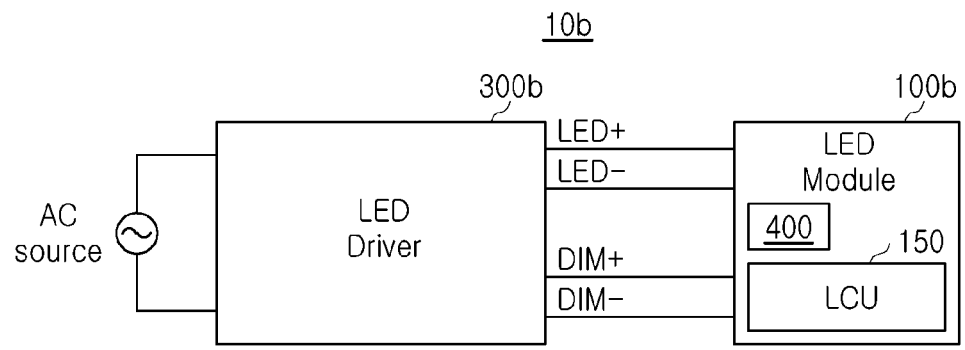
FIG. 3 is a view illustrating a lighting device 10b according to another example embodiment.

FIG. 3 is a view illustrating a lighting device 10b according to another example embodiment. Referring to FIG. 3, the lighting device 10b may include an LED module 100b and an LED driver 300b. The lighting device 10b has an LED control unit 150 (LCU) mounted on the LED module 100b compared to that illustrated in FIG. 1. As illustrated in FIG. 3, when configuring the LED control unit 150, power is supplied from the positive terminal (LED+), and current may be distributed to the warm/cool LED string inside the LED module 100b. Afterwards, the current distributed from the ground of the Warm/Cool LED string may be combined and returned to the negative terminal (LED−).

Figure 4:
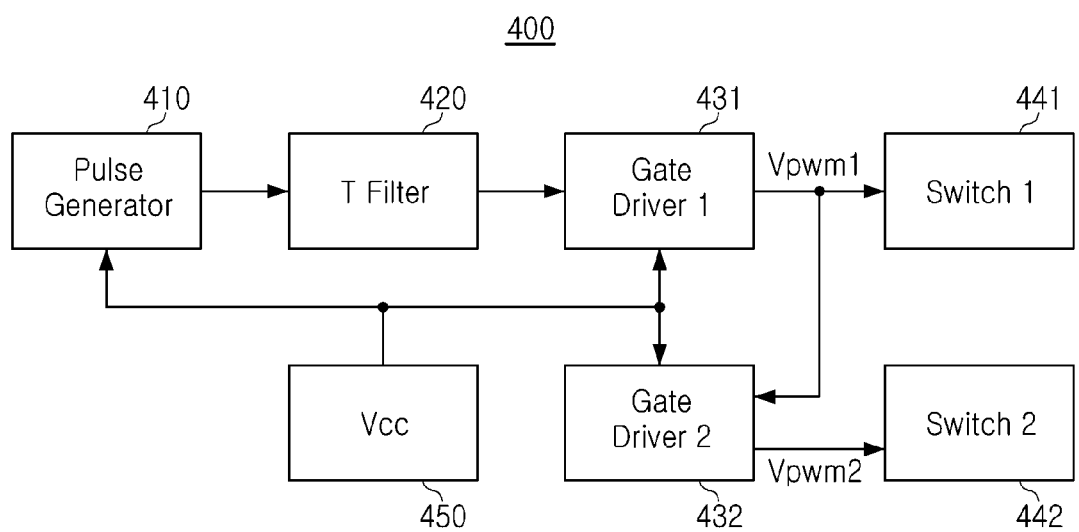
FIG. 4 is a diagram illustrating a color temperature controller 400 of an LED control unit (LCU) according to an example embodiment, as an example.

FIG. 4 is a diagram exemplarily illustrating a color temperature controller 400 of an LED control unit (LCU) according to an example embodiment. Referring to FIG. 4, the color temperature controller 400 of the LCU includes a pulse generator 410, a T-filter 420, first and second gate drivers 431 and 432, first and second switches 441, 442) and a power supply circuit (450; Vcc). Examples of switches 441 and 442 controlling LED strings is shown as the pair of transistors Q1 and Q2 in FIG. 21 controlling LED strings 1110 and 1120.

The pulse generator 410 may be implemented to generate a pulse signal with a constant frequency of 50% duty. The T-filter 420 may be implemented to receive a pulse signal from the pulse generator 410 and convert the received pulse signal into a triangular wave form. Each of the first and second gate drivers 431 and 432 receives the converted signal of the T-filter 420 and outputs PWM signals VPWM1 and VPWM2 for warm/cool LED string driving. In an example embodiment, each of the first and second gate drivers 431 and 432 may be implemented as a Schmitt trigger IC. At this time, the slope of the triangular wave may be adjusted in the T-filter 420. The timing at which the trigger level of the Schmitt trigger is reached may be changed according to the slope of the triangular wave. According to this timing change, the duty ratio of each of the PWM signals VPWM1 and VPWM2 may be set.

Figure 5:
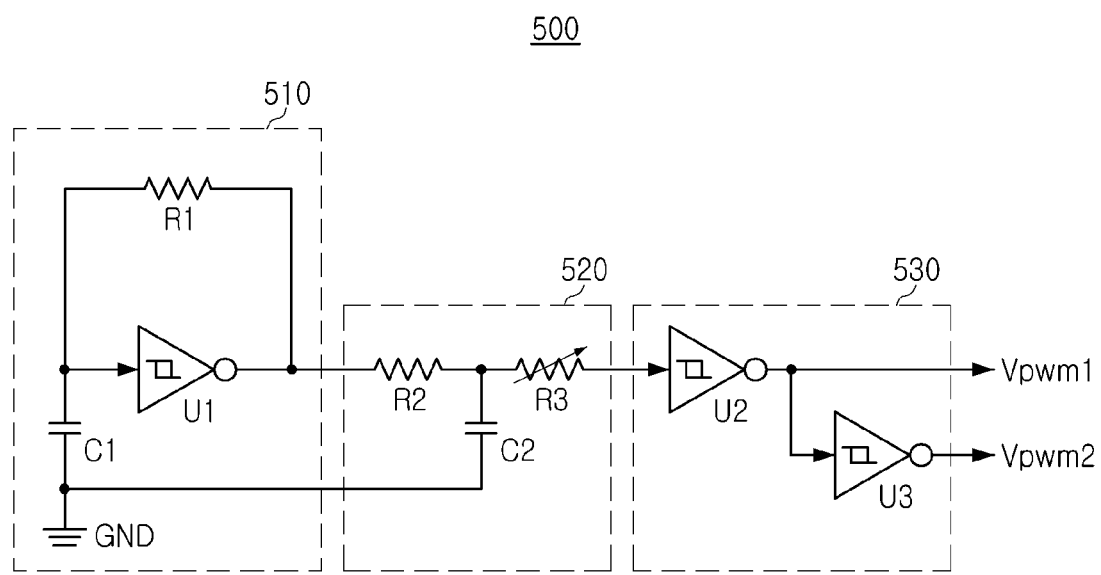
FIG. 5 is a diagram illustrating an LED control unit 500 according to an example embodiment.

FIG. 5 is a diagram illustrating an LED control unit 500 according to an example embodiment. Referring to FIG. 5, the LED control unit 500 may include a pulse generator 510, a T-filter 520, and a gate driver 530.

The pulse generator 510 may include a first resistor R1, a first capacitor C1, and a first Schmitt trigger inverter U1. The first resistor R1 may be connected between the input terminal and the output terminal of the first Schmitt trigger inverter U1. The first capacitor C1 may be connected between one end of the first resistor R1 and the ground terminal GND. Also, the pulse generator 510 may determine the output frequency by the time constant of the first resistor R1 and the first capacitor C1. In general, a micro control unit (MCU) is limited to a PWM output frequency of 4 KHz, but the pulse generator 510 of the LCU may set more than several tens of KHz. The first Schmitt trigger inverter U1 may determine a +trigger level and a −trigger level according to the supply voltage level. The output frequency of the pulse generator 510 may be set through the +trigger level of the first Schmitt trigger inverter U1, the −trigger level, and the time constant of the first resistor R1 and the first capacitor C1. Also, the output of the pulse generator 510 may be input to the T-filter 520.

The T-filter 520 may be implemented to convert the square wave signal output from the pulse generator 510 into a triangle wave signal. The T-filter 520 may include second and third resistors R2 and R3 and a second capacitor C2. The second resistor R2 may be connected to the other end of the first resistor R1. The third resistor R3 may be connected to the other end of the second resistor R2. The second capacitor C2 may be connected between the other terminal of the second resistor R1 and the ground terminal GND. For example, the T-filter 520 may convert the square wave signal output from the pulse generator 510 into a triangular wave signal by the time constant of the second resistor R2 and the second capacitor C2. In this case, the gradient of the triangular wave input to the second Schmitt trigger inverter U2 may be adjusted by the resistance value of the third resistor R3. For example, the pulse input from the pulse generator 510 is output as a DC voltage including a ripple in the form of a triangular wave by the time constant of the T-filter 520, and according to the resistance value of the third resistor R3. The slope of the triangular wave may be determined.

Accordingly, the PWM duty ratio may be set by setting the time to reach the +/−trigger level of the second Schmitt trigger inverter U2. For example, a difference in time to reach the trigger level of the gate drive U2 may occur according to the slope of the triangular wave output from the T-filter 520. As a result, the PWM duty ratio may be varied. For example, when the slope of the triangular wave is steep, the duty ratio of the first PWM signal Vpwm1 will decrease because it takes a relatively short time to reach the +trigger level of the Schmitt trigger inverter U2. Conversely, when the slope of the triangle wave is gentle, the duty ratio of the first PWM signal Vpwm1 will increase because it takes a relatively long time to reach the +trigger level of the Schmitt trigger inverter U2.

The gate driver 530 may receive an output signal of the T-filter 520 and output PWM signals Vpwm1 and Vpwm2. The gate driver 530 may include second and third Schmitt trigger inverters U2 and U3. In this case, the second Schmitt trigger inverter U2 is a first gate driver outputting a first PWM signal Vpwm1, and the second Schmitt-trigger inverter U2 and the third Schmitt-trigger inverter U3 are second gate drivers that output the second PWM signal Vpwm2. When the duty ratio of the first PWM signal Vpwm1 is determined by the T-filter 520, by inverting the first PWM signal Vpwm1, the second PWM signal Vpwm2 may be generated.

In addition, the warm LED string and the cool LED string require complementary switching driving. For this reason, the output Vpwm1 of the second Schmitt-trigger inverter U2 may be input to the third Schmitt-trigger inverter U3. The third Schmitt-trigger inverter U3 may output the second switch driving voltage, for example, the second PWM signal Vpwm2.

Figure 6A:
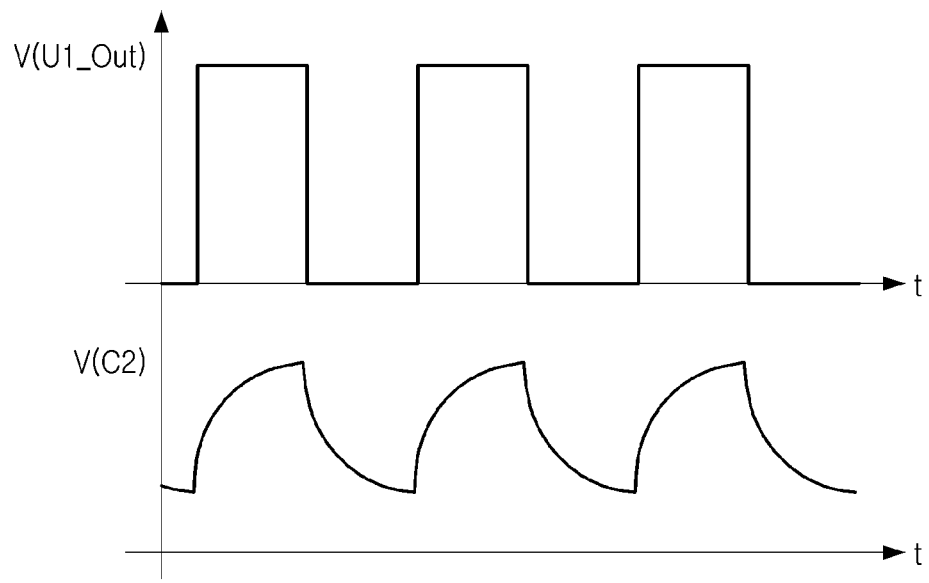
FIGS. 6A and 6B are diagrams illustrating an operating waveform of the LED control unit 500 illustrated in FIG. 5 by way of example.
Figure 6B:
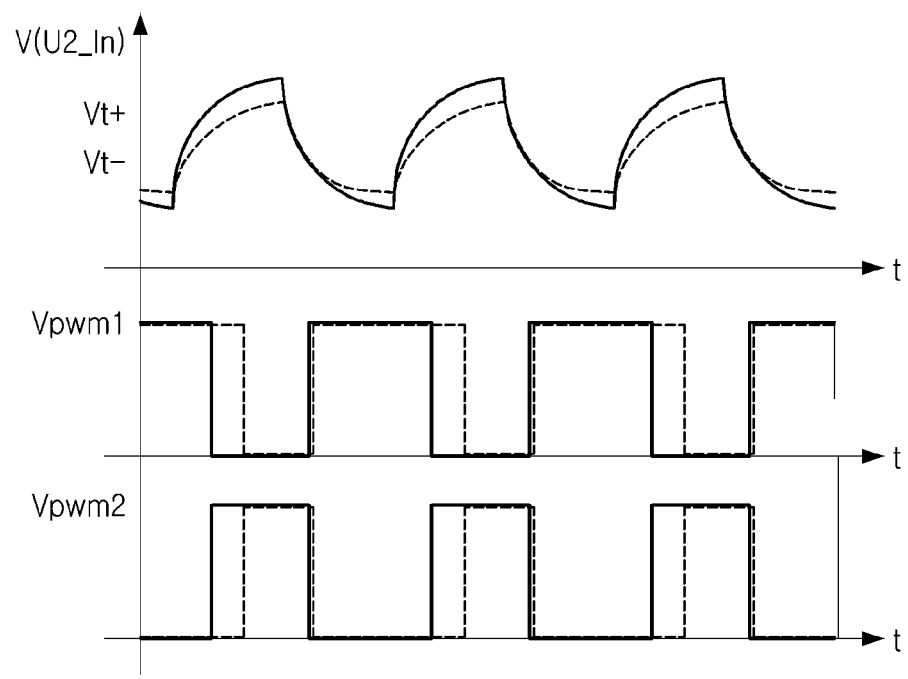

FIGS. 6A and 6B are diagrams exemplarily illustrating operating waveforms of the LED control unit 500 illustrated in FIG. 5.

V(U1_Out) is the output of the pulse generator 510, and V(C2) is the output waveform of the T-filter 520. As illustrated in FIG. 6A, the pulse frequency of V(U1_Out) may be adjusted by changing the time constant of the first resistor R1 and the first capacitor C1. V(U2_In) is the input of the gate driver (U2), Vt+ illustrates the +trigger level of the gate driver (U2), and Vt− illustrates the −trigger level of the gate driver (U2). As illustrated in FIG. 6B, by controlling the time to reach the +trigger level and the −trigger level through the resistance value of the third resistor R3 of the T-filter 520, the PWM duty ratio of the Warm/Cool LED string may be variable.

In an example embodiment, the time to reach the +/−trigger level may be controlled by changing the resistance value of the second resistor R2 of the T-filter 520. This method of changing the resistance value of the second resistor R2 may affect the set pulse frequency by changing the amount of feedback current of the pulse generator 510. Accordingly, the PWM duty ratio may be adjusted by changing the resistance value of the third resistor R3. As illustrated in FIG. 5, when a variable resistor is used as the third resistor R3, a desired color temperature may be set within the range of 2700K to 6000K.

The LED control unit according to an example embodiment may arrange a plurality of selectable resistors corresponding to the resistor R3 illustrated in FIG. 5.

Figure 7:
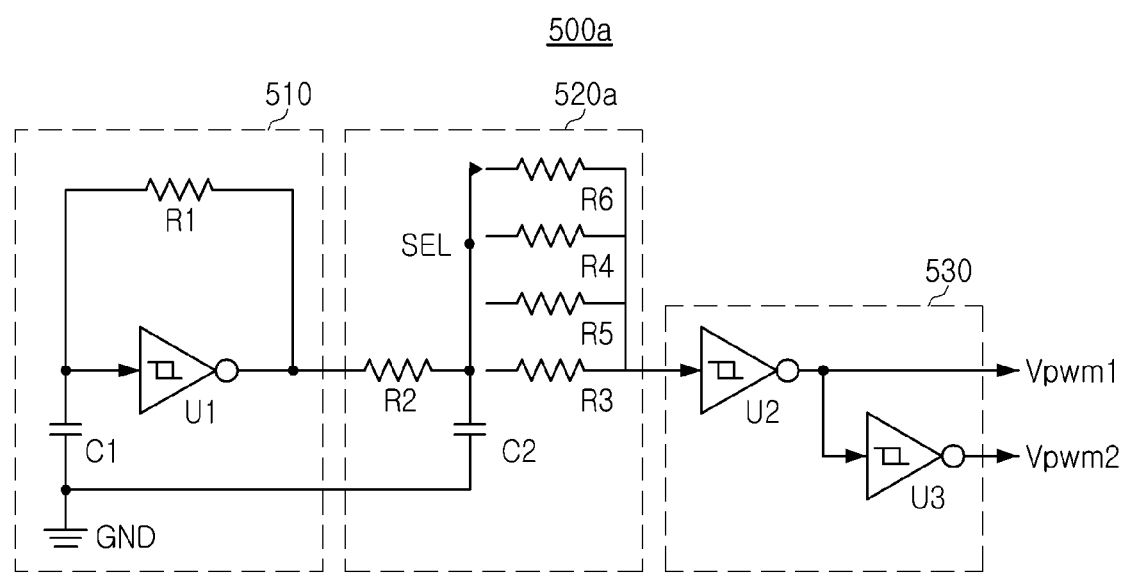
FIG. 7 is a diagram illustrating an LED control unit 500a according to another example embodiment.

FIG. 7 is a diagram illustrating an LED control unit 500a according to another example embodiment. Referring to FIG. 7, the LED control unit 500a may include a pulse generator 510, a T-filter 520a, and a gate driver 530. The LED control unit 500a may include a T-filter 520a selecting different resistance values through a selectable switch (SEL) compared to that of FIG. 5. Depending on the selection resistors (R3, R4, R4 and R6) of the T-filter 520a, the color temperature may be set step by step.

The LED control unit (LCU) according to an example embodiment may be implemented as a circuit in which a T-filter is replaced with a low pass filter and a comparator.

Figure 8:
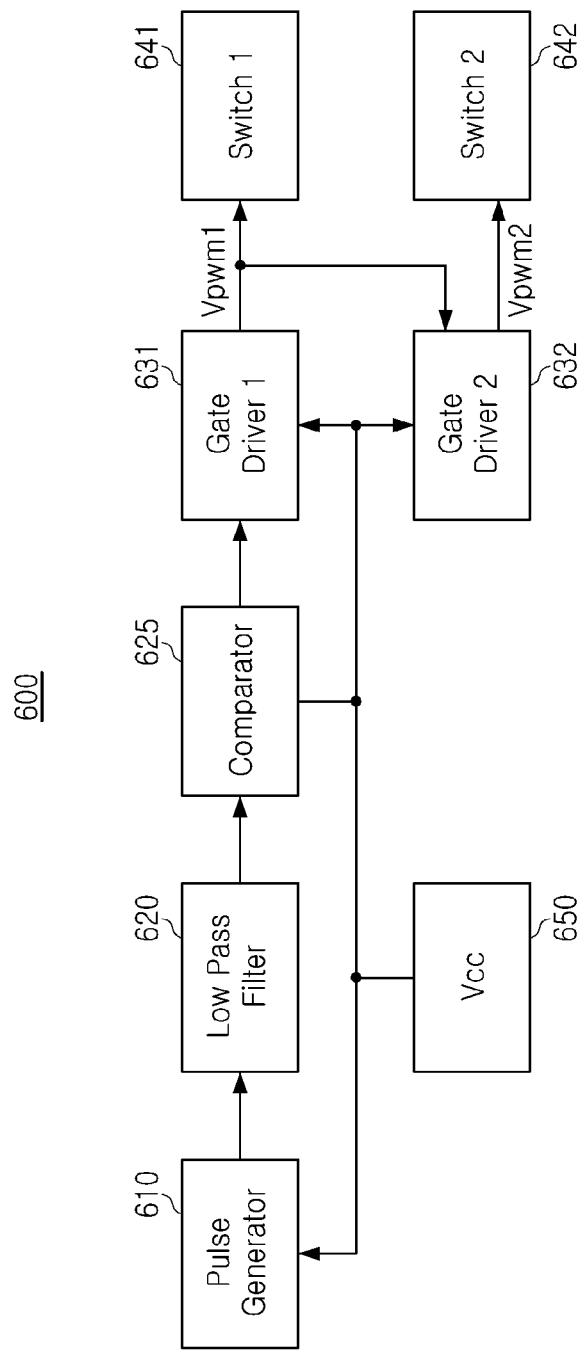
FIG. 8 is a diagram illustrating a color temperature controller 600 of an LED control unit (LCU) according to another embodiment as an example.

FIG. 8 is a diagram exemplarily illustrating a color temperature controller 600 of an LED control unit (LCU) according to another embodiment. Referring to FIG. 8, the color temperature controller 600 of the LCU may include a pulse generator 610, a low-pass filter 620, a comparator 625, first and second gate drivers 631 and 632, first and second switches 641 and 642, and a power generation circuit 650. The color temperature controller 600 illustrated in FIG. 8 may be implemented in a structure in which the T-filter is replaced with a low-pass filter 620 and a comparator 625 compared to that 400 illustrated in FIG. 4.

Figure 9:
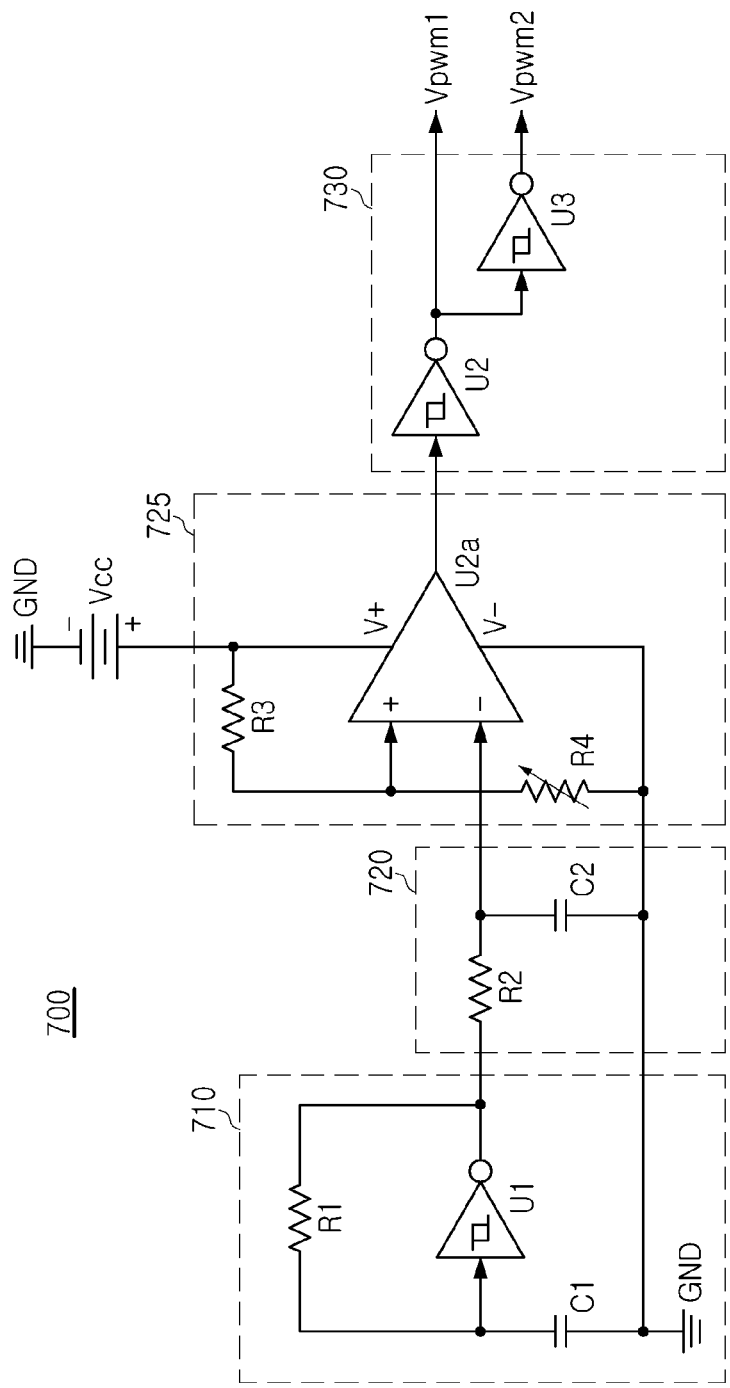
FIG. 9 is a diagram illustrating an LED control unit 700 according to another example embodiment.

FIG. 9 is a diagram illustrating an LED control unit 700 according to another example embodiment. Referring to FIG. 9, the LED control unit 700 may include a pulse generator 710, a low-pass filter 720, a comparator 725, and a gate driver 730.

The pulse generator 710 may include a Schmitt trigger inverter (U1), a capacitor (C1) and a feedback resistor (R1). The Schmitt trigger inverter (U1) may determine +trigger level and −trigger level according to the size of the supply voltage. In an example embodiment, the output frequency of the pulse generator 710 may be set through the +trigger level and −trigger level of the Schmitt trigger inverter U1 and the time constant of the resistor R1 and the capacitor C1. In an example embodiment, the output of the pulse generator 710 may be input to the low-pass filter 720.

The low-pass filter 720 may be implemented to convert a pulse input from the pulse generator 710 into a DC voltage including a triangular wave-shaped ripple. The low-pass filter 720 may include a resistor R2 and a capacitor C2. One end of the resistor R2 may be connected to the output terminal of the Schmitt trigger inverter U1, and the other end of the resistor R2 may be connected to the capacitor C2. Capacitor C2 may be connected between the other end of resistor R2 and the ground terminal GND.

The comparator 725 may include an operational amplifier U2a. An output signal of the low-pass filter 720 may be input to an inverting terminal of the operation amplifier U2a. The DC power source Vcc may be input to a non-inverting terminal of the operation amplifier U2a at a constant voltage by a voltage divider circuit composed of a resistor R3 and a resistor R4. The reference voltage of the operation amplifier U2a may be determined according to the resistance values of the resistors R3 and R4. Depending on the reference voltage determined in this way, the PWM duty ratio may be varied.

The gate driver 730 may include first and second gate drivers U3 and U4. In this case, each of the first and second gate drivers U3 and U4 may be implemented as a Schmitt trigger inverter. Since the Warm LED string and the Cool LED string require complementary switching driving, the output of the first gate driver U3 may be input to the second gate driver U4 to output a switch driving voltage.

Figure 10A:
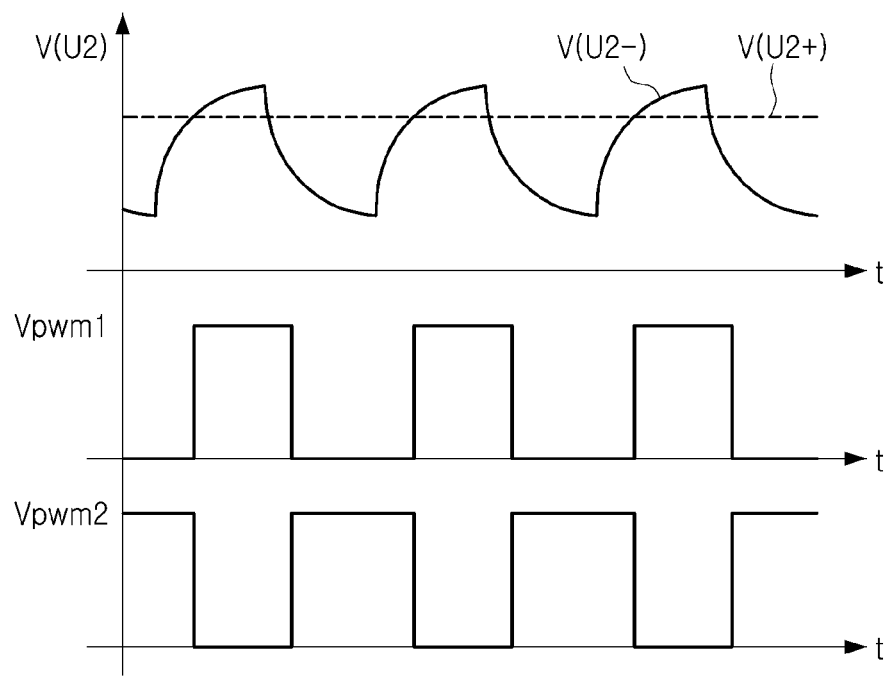
FIGS. 10A and 10B are diagrams illustrating operational waveforms of the LED control unit 700 illustrated in FIG. 9 according to an example embodiment.
Figure 10B:
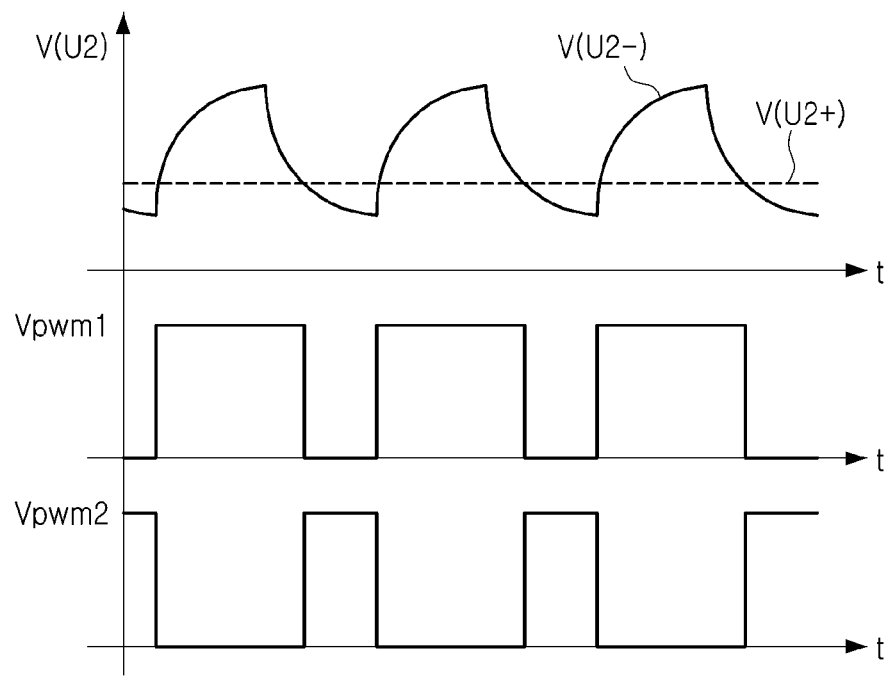

FIGS. 10A and 10B are diagrams exemplarily illustrating operational waveforms of the LED control unit 700 illustrated in FIG. 9. When the resistance value of the resistor R4 is set relatively high, as illustrated in FIG. 10A, a turn-on period of the first PWM signal Vpwm1 (first gate control signal) may increase as the reference voltage increases. Conversely, when the resistance value of the resistor R4 is set relatively small, as illustrated in FIG. 10B, the turn-on period of the second PWM signal (Vpwm2: second gate control signal) may be reduced by decreasing the reference voltage./

Meanwhile, when a variable resistor is used for the resistor R4 illustrated in FIG. 9, a desired color temperature may be set within the range of 2700K to 6000K.

Figure 11:
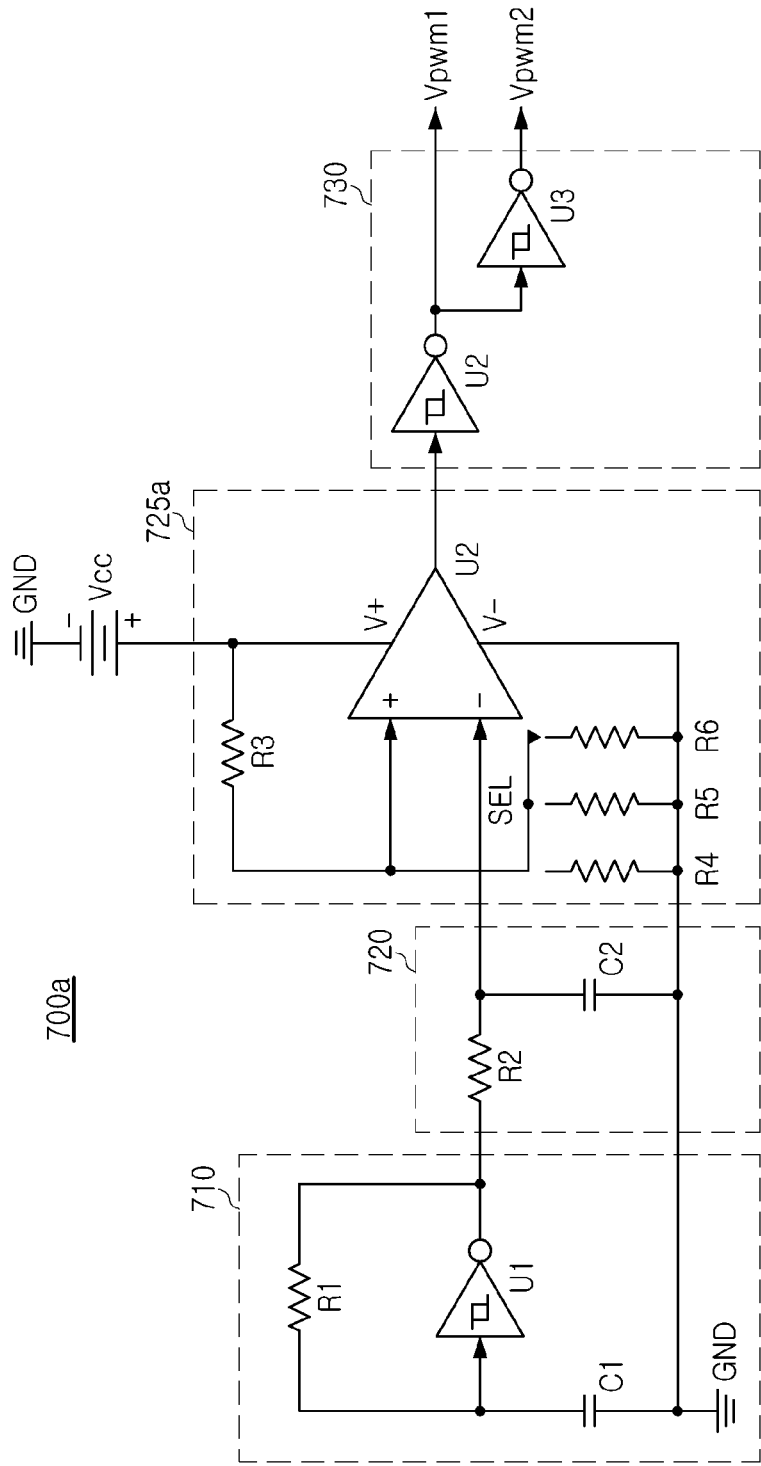
FIG. 11 is a diagram illustrating an LED control unit 700a according to another example embodiment.

FIG. 11 is a diagram illustrating an LED control unit 700a according to another example embodiment. Referring to FIG. 11, the LED control unit 700a has a comparator 725a selecting different resistance values through a selectable switch (SEL) by positioning a plurality of resistors R4, R5, and R6, compared to that 700 illustrated in FIG. 9. The LED control unit 700a may select a color temperature step by step by selecting a resistance.

The power supply circuit may use a linear regulator IC or a switching buck converter according to current consumption and system efficiency of the IC. The regulator IC has the advantage of having a small number of peripheral parts and no switching noise. Since the amount of power consumed and the amount of heat generated by the regulator IC increases by the difference between the input voltage and the output voltage, the suppliable current capacity may decrease and the power conversion efficiency may deteriorate. Regulator ICs are suitable for circuits where the difference between the input voltage and output voltage is not large and the supply current is small. In general, buck converters may consist of inductors, diodes, capacitors and switches. The buck converter may stably supply a large amount of current and has excellent power conversion efficiency. Therefore, buck converters are suitable for circuits that have a large difference between input voltage and output voltage and require high efficiency and large current supply.

Since the amount of current supplied to the logic IC (e.g., U1, U2, and U3) is as small as several tens of mA or less, the LED control unit (LCU) according to the example embodiment may apply a linear regulator. The power generation circuit of the LCU may be implemented as a circuit in a constant voltage control method by stepping down the output voltage of the LED driver.

In general, the output voltage of the LED driver of the constant current control method may be determined according to the forward voltage (Vf, Forward Voltage) of the LED module. For example, when an LED module having a forward voltage Vf of 50V DC is connected to an LED driver, an output voltage of the LED driver may be 50V DC. The output voltage of the LED driver may be input to the power supply circuit of the LED control unit (LCU), step down to a desired voltage, and supply power to the color temperature controller. If the input voltage of the LED control unit (LCU) is 50V DC and the supply voltage of the color temperature controller is 5V DC, 45V DC may be applied to Vce (collector and emitter voltage) of the transistor constituting the regulator. At this time, if the supply current is 10 mA, the transformer should dissipate 450 mW of power as heat. This may cause malfunction or component damage due to heat generation. To solve this heat generation problem, the amount of heat generated may be distributed by connecting a plurality of regulators in series.

For example, when two regulators are connected in series and the output voltage of the first regulator is set to 25V DC, the input voltage of the first regulator is 50V DC and the output voltage is 25V DC. The input voltage of the second regulator may be 25V DC, and the output voltage may be 5V DC. At this time, the power consumption of the first regulator is 250 mW and the power consumption of the second regulator is 200 mW, such that the power consumption may be distributed. This may improve the temperature problem. However, when the forward voltage (Vf) of the LED module is less than or equal to the output voltage of the first regulator, a situation in which the LED control unit does not operate may occur because the output of the first regulator is cut off. Embodiments expand the compatibility between the LED driver and the LED control unit by adding a circuit that bypasses the first regulator and drives only the second regulator when the forward voltage (Vf) of the LED module is less than or equal to the output voltage of the first regulator.

Figure 12:
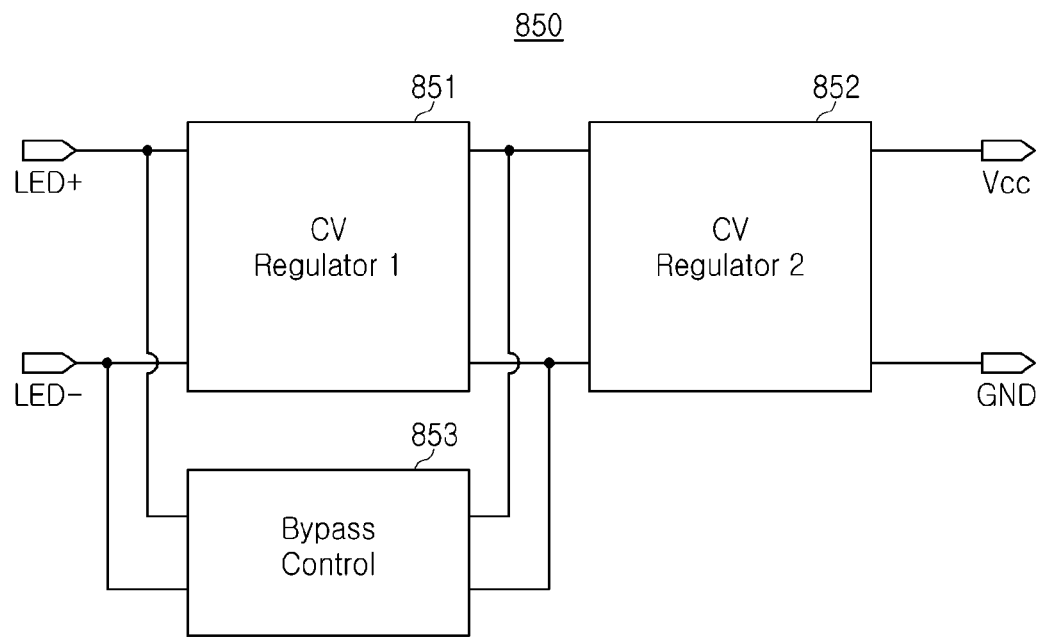
FIG. 12 is a diagram illustrating a voltage generation circuit 850 of an LED control unit (LCU) according to an example embodiment.

FIG. 12 is a diagram illustrating a voltage generation circuit 850 of an LED control unit (LCU) according to an example embodiment. Referring to FIG. 12, the voltage generation circuit 850 may include a first regulator 851, a second regulator 852, and a bypass control circuit 853.

The bypass control circuit 853 may be implemented to perform bypass control for the current path. In an example embodiment, the bypass control circuit 853 may sense the output voltage of the LED driver and conduct a PNP transistor (e.g., Q5 in FIG. 15) when the output voltage is lower than a specific voltage. At this time, power may be supplied by bypassing the first regulator 851 and operating only the second regulator 852. In another embodiment, the bypass control circuit 853 blocks the transistor Q5 when the output voltage of the LED driver is higher than a specific voltage, and the first regulator 851 and the second regulator 852 may be sequentially driven. This may be expected to have the effect of dispersing the voltage/temperature stress of the second regulator 852.

The voltage generation circuit 850 of the LED control unit (LCU) according to an example embodiment may distribute voltage/temperature stress by sequentially driving the first regulator 851 and the second regulator 852, when the output voltage of the LED driver is high through the bypass control circuit 853, and may expand compatibility between the LED driver of various output voltages and the LED control unit (LCU) by driving only the second regulator 852, when the output voltage of the LED driver is low.

Figure 13:
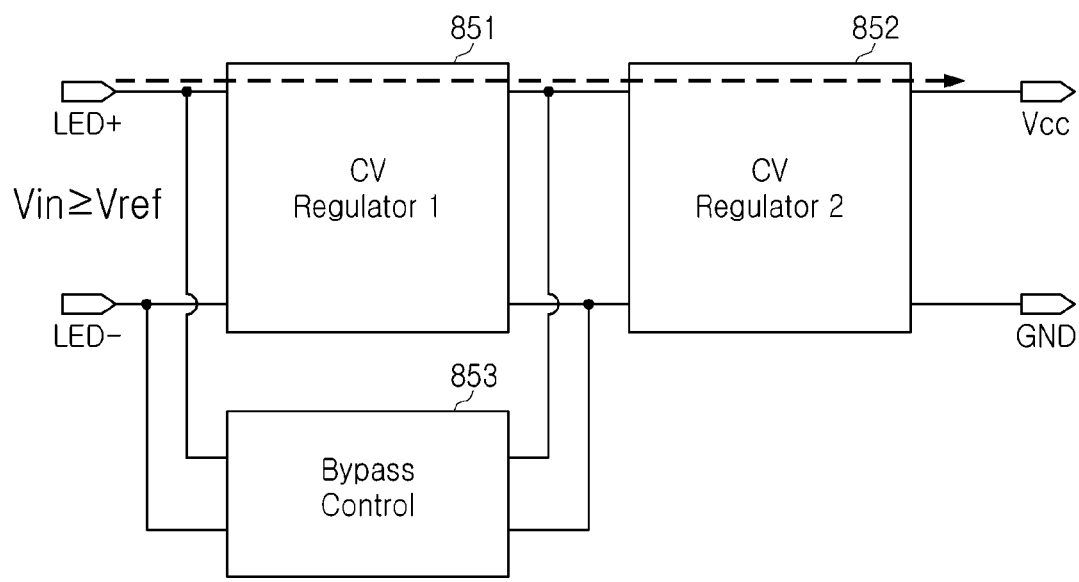
FIG. 13 is a diagram illustrating a current path when the LED module voltage (LED+) is higher than the reference voltage in the voltage generation circuit 850 illustrated in FIG. 12 according to an example embodiment.

FIG. 13 is a diagram exemplarily illustrating a current path when the LED module voltage (LED+) is higher than the reference voltage in the voltage generation circuit 850 illustrated in FIG. 12. If the forward voltage (Vf: Vin) of the LED module is higher than the reference voltage (Vref), the bypass control circuit 853 is inactivated to distribute the power consumption of the first regulator 851 and the second regulator 852, and the current path is as illustrated in FIG. 13.

Figure 14:
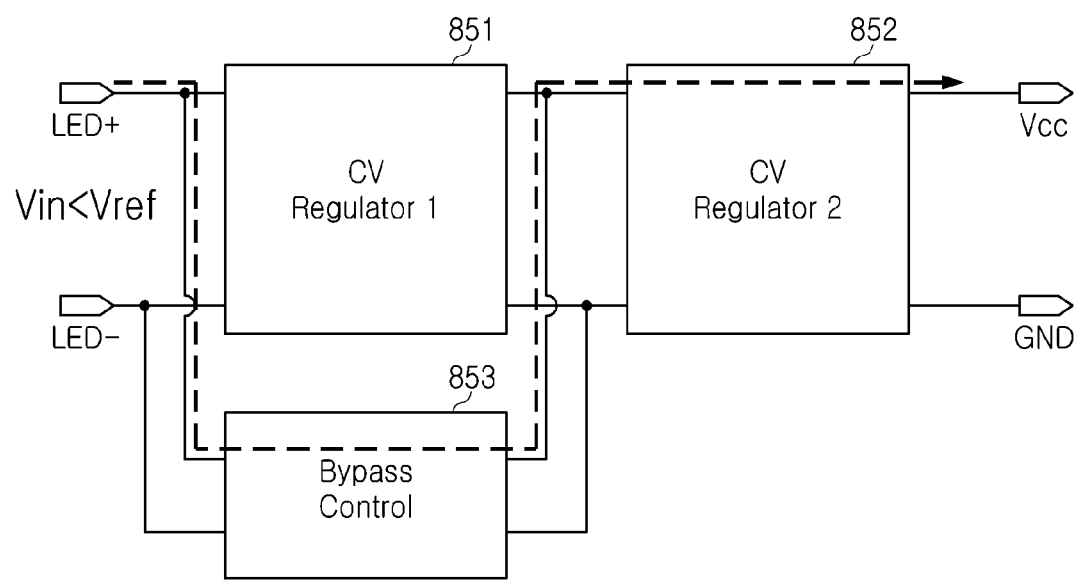
FIG. 14 is a diagram illustrating a current path when the LED module voltage (LED+) is lower than the reference voltage in the voltage generation circuit 850 illustrated in FIG. 12 according to an example embodiment.

FIG. 14 is a diagram exemplarily illustrating a current path when the LED module voltage (LED+) is lower than the reference voltage in the voltage generation circuit 850 illustrated in FIG. 12. When the forward voltage (Vf: Vin) of the LED module is lower than the reference voltage (Vref), the bypass control circuit 853 is activated to prevent the output of the first regulator 851 from being cut off, such that the current path is As illustrated in 14.

Figure 15:
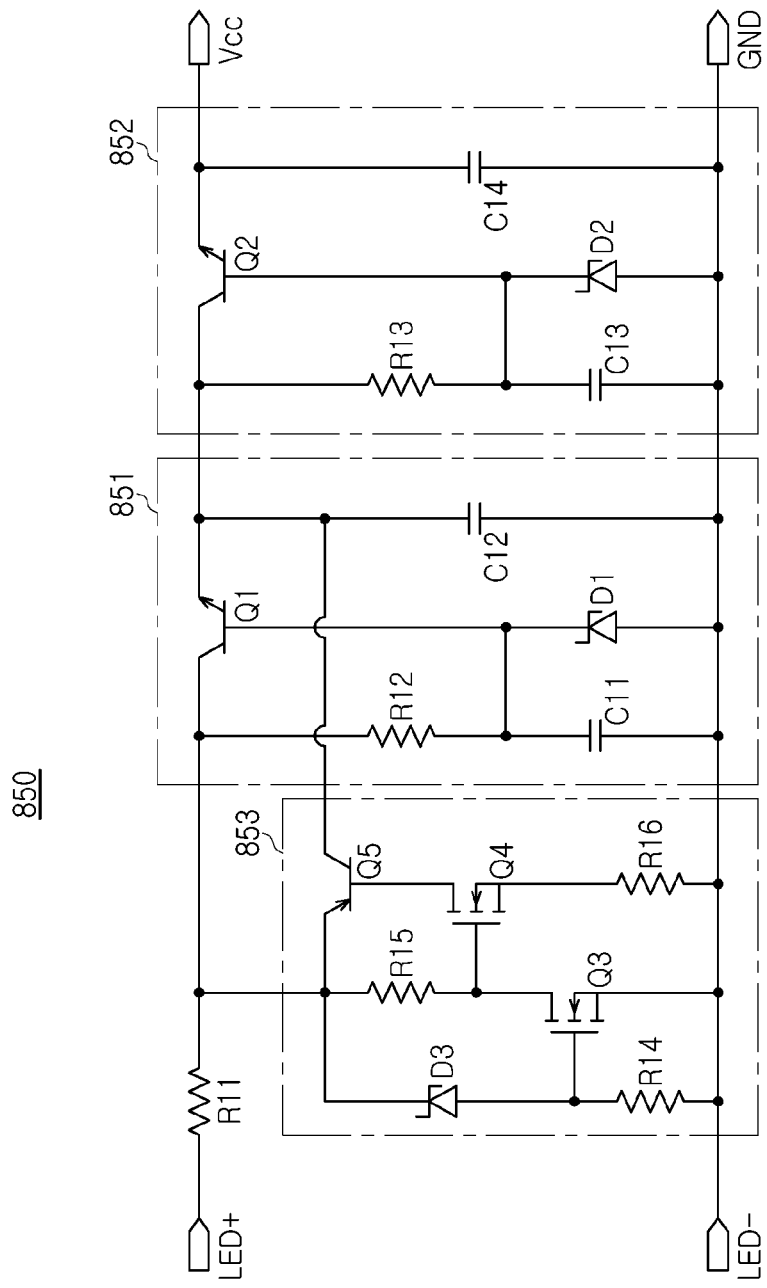
FIG. 15 is a diagram illustrating a voltage generation circuit 850 according to an example embodiment.

FIG. 15 is a diagram exemplarily illustrating a voltage generation circuit 850 according to an example embodiment.

Referring to FIG. 15, the voltage generation circuit 850 may include a first regulator 851, a second regulator 852, and a bypass control circuit 853.

Each of the first regulator 851 and the second regulator 852 may be implemented as a constant voltage regulator. In this case, the constant voltage regulator may be implemented with NPN transistors Q1 and Q2, zener diodes D1 and D2, resistors R12 and R13, and capacitors C11, C12, C13 and C14. The bypass control circuit 853 may be implemented with FET transistors Q3 and Q4, a PNP transistor Q5, a Zener diode D3, and resistors R14 and R16. Q1 is coupled to an output LED+ terminal at a first terminal of a resistor R11. A second terminal of the resistor R11 is coupled to a first terminal of a resistor R15. A second terminal of the resistor R15 is coupled to a gate of Q4, as shown in FIG. 15.

Figure 16:
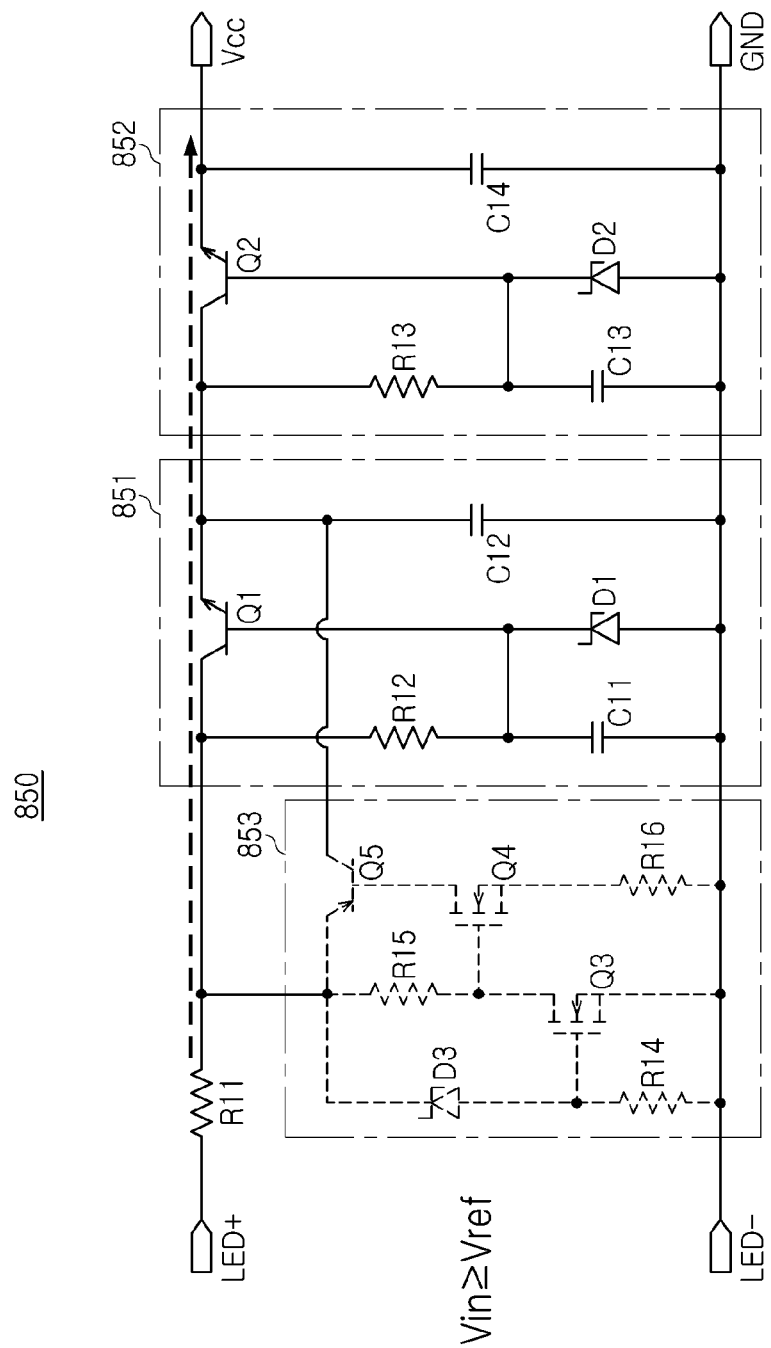
FIG. 16 is a diagram illustrating a current path when the input voltage Vin is higher than the reference voltage Vref in the voltage generation circuit 850 illustrated in FIG. 15 according to an example embodiment.

FIG. 16 is a diagram exemplarily illustrating a current path when the input voltage Vin is higher than the reference voltage Vref in the voltage generation circuit 850 illustrated in FIG. 15. As illustrated in FIG. 16, when the input voltage Vin is higher than the reference voltage Vref, the diode D3 conducts, a constant voltage is applied to the resistor R14, and the transistor Q3 turns on. As the transistor Q3 is turned on, the gate voltage of the transistor Q4 may be at the same potential as the ground. Transistor Q4 may remain turned off. As the transistor Q4 is turned off, the Vbe (base and emitter voltages) of the transistor Q5 may be of the same potential. As the transistor Q5 is also turned off, the first regulator 851 operates normally.

Figure 17:
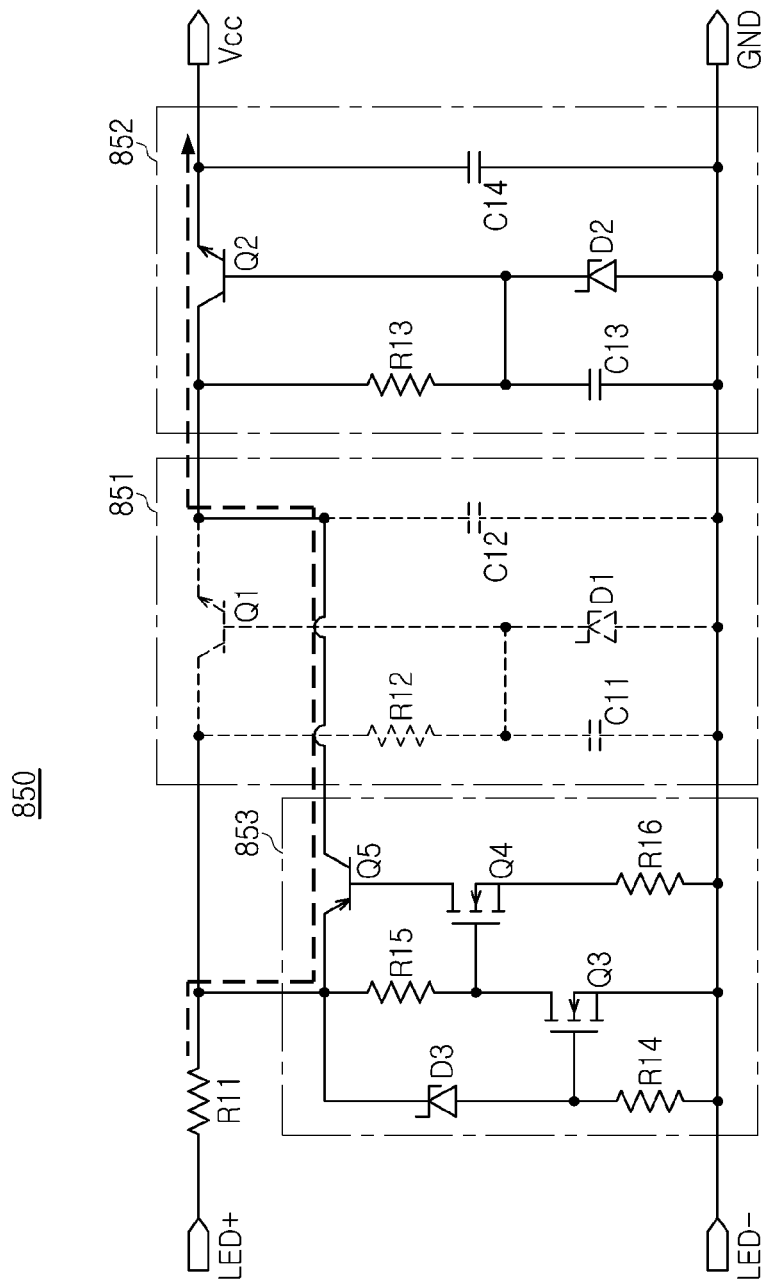
FIG. 17 is a diagram illustrating a current path when the input voltage Vin is less than the reference voltage Vref in the voltage generation circuit 850 illustrated in FIG. 15 according to an example embodiment.

FIG. 17 is a diagram exemplarily illustrating a current path when the input voltage Vin is lower than the reference voltage Vref in the voltage generation circuit 850 illustrated in FIG. 15. As illustrated in FIG. 17, when the input voltage Vin is less than 25V, the diode D3 is turned off and no voltage is applied to the resistor R14. Accordingly, as the transistor Q3 is turned off, the impedance may increase infinitely. When a voltage sufficient to cause transistor Q4 to conduct is applied to the gate of transistor Q4, transistor Q4 may be turned on. As the transistor Q4 is turned on, a difference between Vbe (base and emitter voltages) of the transistor Q5 is generated such that the transistor Q5 is turned on. Therefore, the output voltage of the LED driver bypasses the first regulator 851 and is input to the second regulator 852, such that the color temperature controller may be normally driven.

Figure 18:
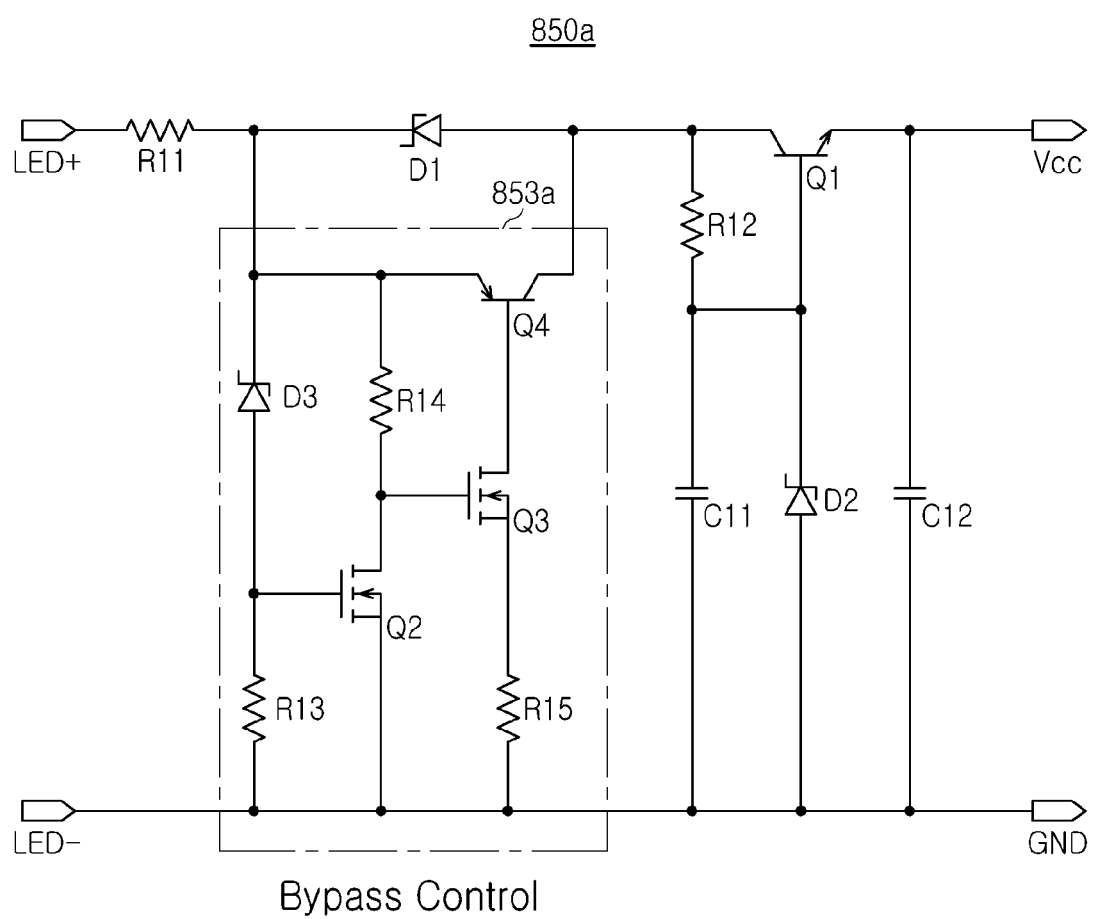
FIG. 18 is a diagram illustrating a current path when the supply current is as small as several mA in the voltage generation circuit 850a of the LED control unit (LCU) according to an example embodiment.

FIG. 18 is a diagram exemplarily illustrating a current path when the supply current is as small as several mA in the voltage generation circuit 850a of the LED control unit (LCU) according to an example embodiment. As illustrated in FIG. 18, when the supply current of the LED color temperature controller of the LCU is as small as several mA, the voltage generation circuit 850a may simply replace the first regulator 851 illustrated in FIG. 15 with the zener diode D1.

The LED control unit (LCU) according to an example embodiment may include a dimming circuit electrically isolated from the color temperature controller.

Figure 19:
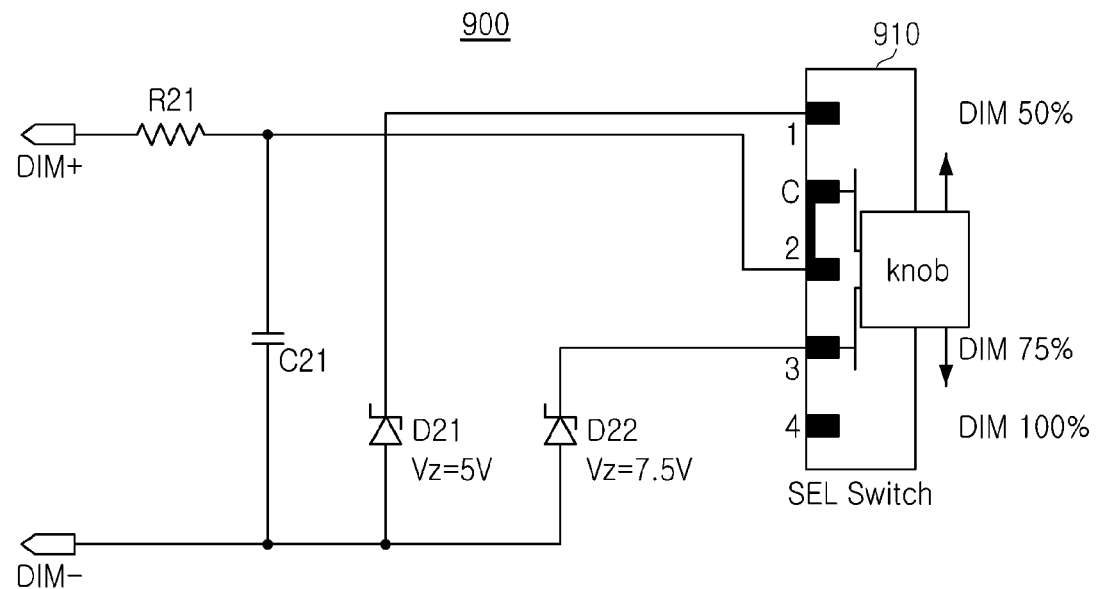
FIG. 19 is a diagram illustrating a dimming circuit 900 of an LED control unit (LCU) according to an example embodiment.

FIG. 19 is a diagram illustrating a dimming circuit 900 of an LED control unit (LCU) according to an example embodiment. Referring to FIG. 19, the dimming circuit 900 may include a selection switch 910, a resistor R21, a capacitor C21, and zener diodes D21 and D22.

The dimming circuit 900 arranges a low-pass filter implemented with a resistor R21 and a capacitor C21 to filter ESD (Electrostatic Discharge) and external noise, and voltages of the zener diodes D21 and D22 may be set according to the dimming ratio. In this case, the low-pass filter may be disposed between the positive dimming terminal (DIM+) and the negative dimming terminal (DIM−). In an example embodiment, the dimming circuit 900 may be implemented in an isolated structure from the color temperature control circuit of the LED control unit (LCU).

A typical LED dimming circuit generates a voltage of 0V to 10V and supplies the voltage to the LED driver. On the other hand, in the dimming circuit 900, the dimming unit inside the LED driver may be implemented by varying the reference. The dimming circuit 900 uses a Zener diode to change the reference potential inside the LED driver, unlike the related art method of supplying a DC voltage from 0V to 10V. Since there is no need to supply a separate DC voltage, the dimming circuit may be implemented simply with relatively few parts.

Figure 20:
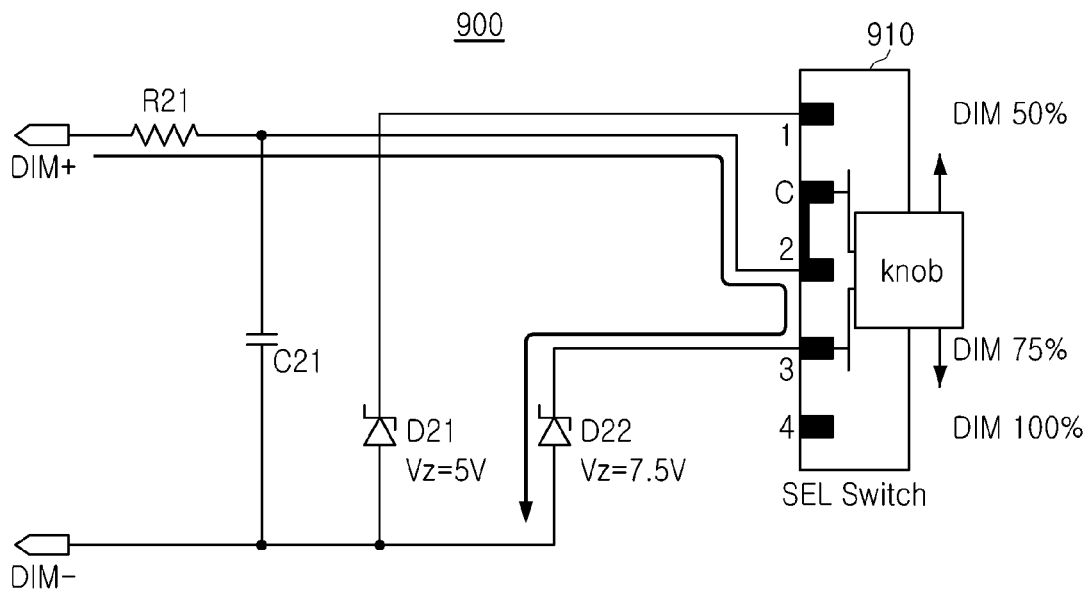
FIG. 20 is a diagram illustrating a current path when the dimming ratio is set to 75% in the dimming circuit 900 illustrated in FIG. 19 according to an example embodiment.

FIG. 20 is a diagram exemplarily illustrating a current path when the dimming ratio is set to 75% in the dimming circuit 900 illustrated in FIG. 19. As illustrated in FIG. 20, a current path may be formed to the Zener diode D2 via the second and third pins of the selection switch 910 via the resistor R21. In general, if the dimming terminal of the LED driver is open, it is set to 100% rated current, and thus, a 10V Zener diode may not be added separately.

Figure 21:
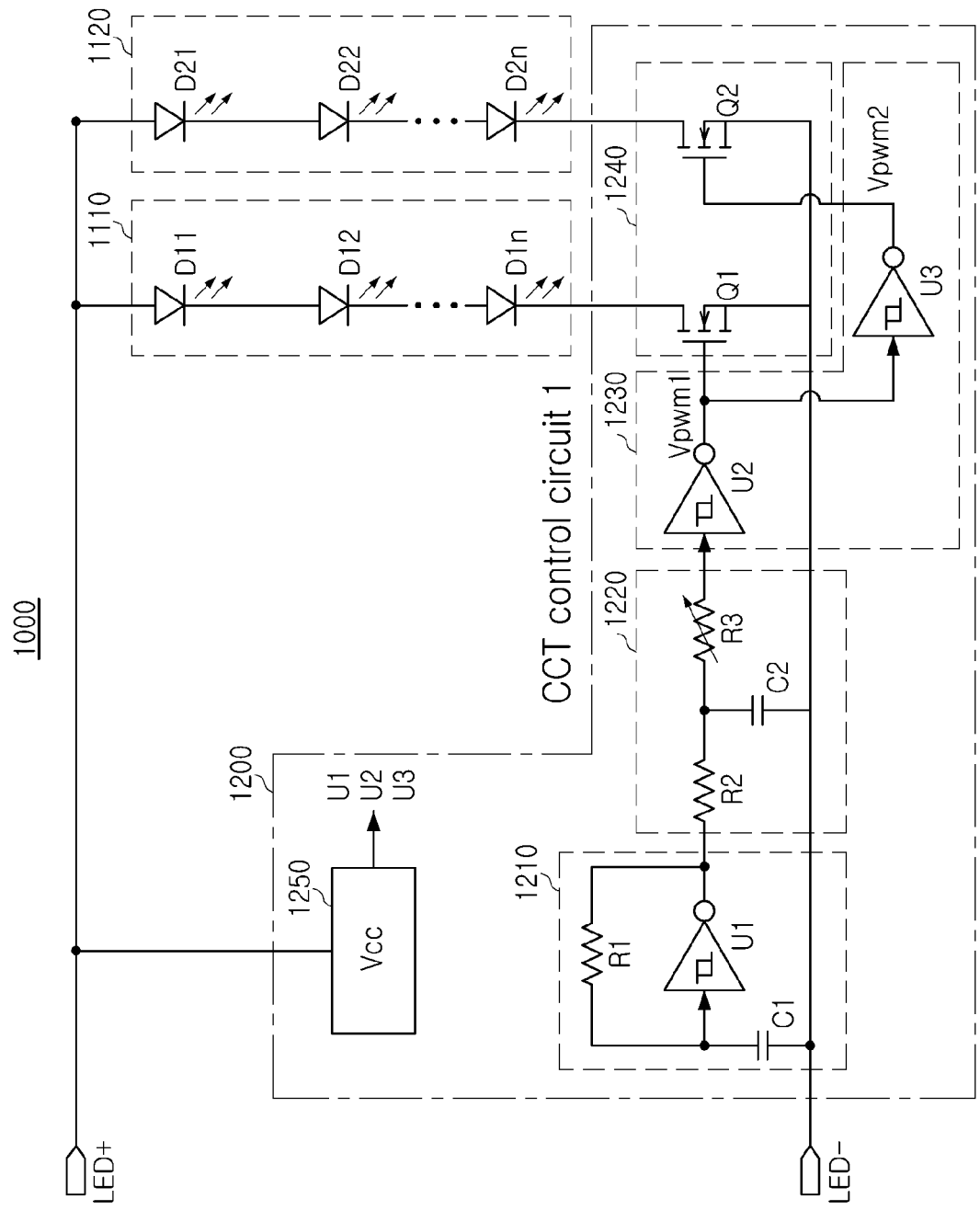
FIG. 21 is a view illustrating a lighting device 1000 according to an example embodiment.

FIG. 21 is a view illustrating a lighting device 1000 according to an example embodiment. Referring to FIG. 21, the lighting device 1000 may include a first LED string 1110, a second LED string 1120, and a color temperature control circuit 1200.

The first LED string 1110 may include Warm LED strings D11, D12, . . . to D1n. The first LED string 1110 may be connected between the positive LED terminal (LED+) and the first switch Q1. The second LED string 1120 may include Cool LEDD strings D21, D22, . . . to D2n. The second LED string 1120 may be connected between the positive LED terminal (LED+) and the second switch Q2. The color temperature control circuit 1200 may include a pulse generator 1210, a T-filter 1220, a gate driver 1230, switches 1240 (Q1 and Q2), and a power generation circuit 1250. The color temperature control circuit 1200 may be implemented in the same way as the color temperature controller of the LED control unit 500 illustrated in FIG. 5.

Figure 22:
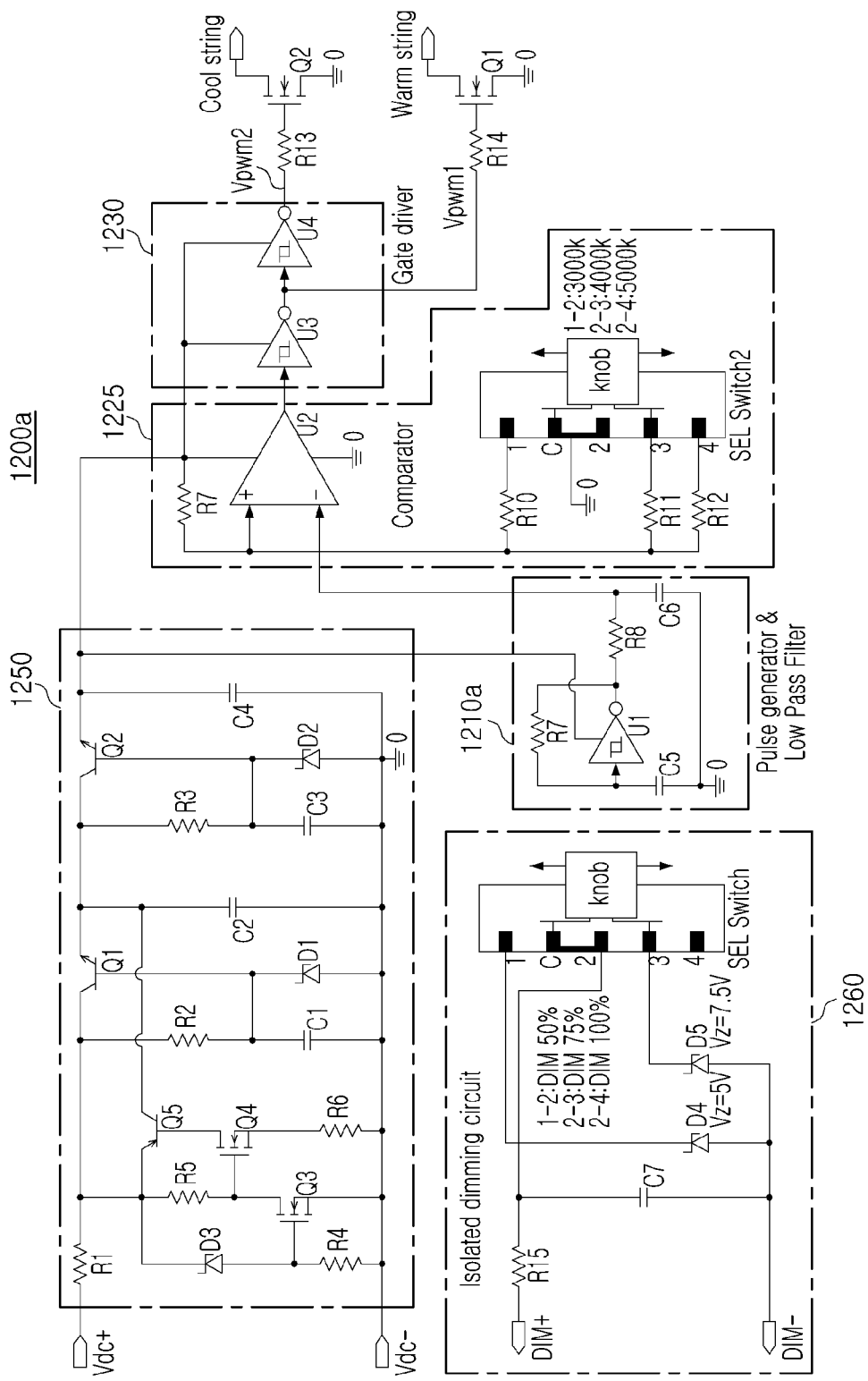
FIG. 22 is a diagram illustrating an LED control unit 1200a (LCU) according to an example embodiment.

FIG. 22 is a diagram illustrating an LED control unit 1200a (LCU) according to an example embodiment. Referring to FIG. 22, the LED control unit 1200a may include a pulse generator and low-pass filter 1210a, a comparator 1225, a gate driver 1230, a power generation circuit 1250, and a dimming circuit 1260.

The pulse generator may increase the pulse frequency to several tens of kHz or more if necessary. Therefore, when audible noise or flicker occurs in the LED module, the pulse generator may be improved by changing the driving frequency. The power generation circuit 1250 may be implemented in the same way as the voltage generation circuit 850 illustrated in FIG. 15. The dimming circuit 1260 has an isolated structure and may be implemented identically to the dimming circuit 900 illustrated in FIG. 19. The supply current of the Warm/Cool LED string is synchronized with the pulse generator's output frequency, supplying current to the Warm LED string at a constant rate within one cycle and then changing the current path to the Cool LED string. For example, if the output frequency of the pulse generator is 500 Hz and the color temperature is set to 5000K, the operation of supplying current for 500 us to the Warm LED string, switching the path to the Cool LED string, and supplying current for 1.5 ms is repeated.

On the other hand, as illustrated in FIG. 22, the LCU (1200a) may be manufactured inexpensively by configuring a circuit with a general-purpose IC and passive components without a Micro Control Unit (MCU) and Low Drop Out (LDO) IC, and responding to semiconductor supply and demand issues is possible. In addition, the lighting device may add color temperature control and dimming functions using a dimmable LED driver. In addition, the lighting device provides improved reliability by verifying compatibility with LED drivers of various topologies.

Figure 23:
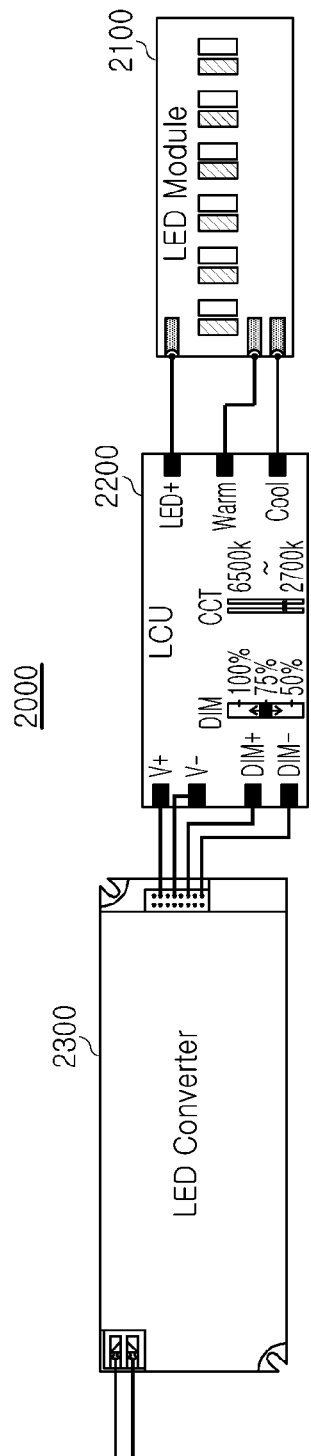
FIG. 23 is a diagram illustrating a lighting device 2000 according to an example embodiment.

FIG. 23 is a diagram illustrating a lighting device 2000 according to an example embodiment. Referring to FIG. 23, a lighting device 2000 may include an LED module 2100, an LCU 2200, and an LED converter 2300.

The LED module 2100 may include a first LED module and a second LED module. In this case, the first LED module may be a 6500K LED module, and the second LED module may be a 2700K LED module. In an example embodiment, the LED module 2100 includes a positive LED voltage (LED+) from the LCU 2200, a first gate control signal (Vpwm1) for turning on a first LED string having a first color temperature (Warm), and An LED module receiving a second gate control signal (Vpwm2) for turning on a second LED string having a second color temperature (Cool) may be included.

The LCU 2200 may be implemented to perform color temperature control or dimming control of the LED module 2100. The LCU 2200 receives a positive LED voltage (V+), a negative LED voltage (V−), a positive dimming voltage (DIM+), and a negative dimming voltage (DIM−) from the LED converter 2300, and receives the color temperature control and dimming control. In an example embodiment, the LCU 2200 may manually change color temperature and set dimming.

The LED converter 2300 may include a dimmable LED driver. The lighting device 2000 according to an example embodiment may manually set color temperature and dimming, and has a simple structure compared to Smart LED lighting. In an example embodiment, the LED converter 2300 receives AC power and may output positive LED voltage (V+), negative LED voltage (V−), positive dimming voltage (DIM+), and negative dimming voltage (DIM−).

Embodiments provide a color temperature/brightness setting function by connecting an LED control unit and a 2700/6500K LED module to a dimmable LED driver without using an expensive LED driver and communication module for Internet of Things (IOT). In this case, the LED control unit is located between the LED driving device and the LED module, and may perform color temperature and dimming functions.

Embodiments achieve the same performance by configuring a complex MCU function with low-cost parts that are easy to supply and demand (MCU/LDO-less). Embodiments secure price competitiveness and shorten delivery time by configuring low-cost parts that are easy to supply and demand. Embodiments are controlled in a tunable manner in the existing three-step selectable (3000K/4000K/5000K) and may implement various color temperatures. UL Safety may be satisfied by making an isolated design between the color temperature control circuit and the dimming circuit. During mass production, processing costs may be reduced by eliminating the firmware downloading process. By applying the PWM method, current drifting of the Warm/Cool LED string may be prevented.

Figure 24:
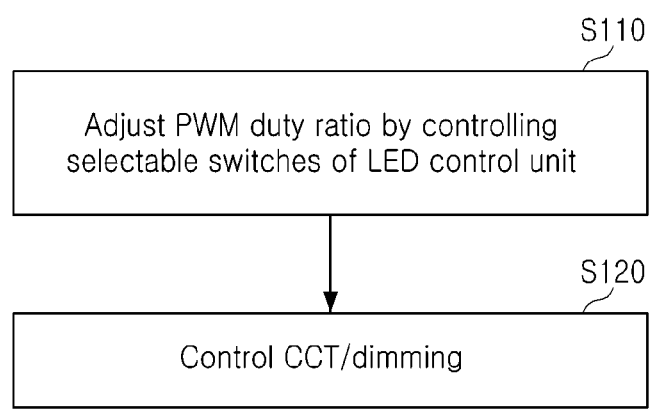
FIG. 24 is a flowchart illustrating a method of operating an LED control unit (LCU) according to an example embodiment.

FIG. 24 is a flowchart illustrating a method of operating an LED control unit (LCU) according to an example embodiment. 1 to 24, the LED control unit (LCU) may operate as follows.

The LED control unit (LCU) may adjust the PWM duty ratio by controlling at least one selection switch (S110). The LED control unit (LCU) may control CCT/dimming of the LED strings according to the adjusted PWM duty ratio (S120).

In an example embodiment, controlling the color temperature or dimming may include turning on a first LED string corresponding to the first color temperature in response to a first gate control signal having a PWM duty ratio and a second gate having a PWM duty ratio. The method may include turning on a second LED string corresponding to a second color temperature lower than the first color temperature in response to a control signal. In an example embodiment, an operating voltage may be received from the LED driver. In an example embodiment, a pulse signal may be generated using a time constant value corresponding to a resistor and a capacitor and a Schmitt trigger inverter, and the pulse signal may be converted into a triangular wave signal. In an example embodiment, adjusting the PWM duty ratio may include controlling a trigger level of the Schmitt trigger inverter or a time to reach the trigger level. In an example embodiment, adjusting the PWM duty ratio may include changing the time constant value of the T-filter to determine the slope of the triangle wave signal.

The apparatus described above may be implemented as hardware components, software components, and/or a combination of hardware components and software components. For example, devices and components described in the example embodiments include a processor, a controller, an arithmetic logic unit (ALU), a digital signal processor, a microcomputer, a field programmable gate array (FPGA), and a programmable logic unit (PLU) unit, a microprocessor, or any other device capable of executing and responding to instructions. The processing device may run an operating system (OS) and one or more software applications running on the operating system. A processing device may also access, store, manipulate, process, and generate data in response to execution of software. For convenience of understanding, the processing device is sometimes described as being used, but those skilled in the art will appreciate that a processing device may include a plurality of processing elements or a plurality of types of processing elements. For example, a processing device may include a plurality of processors or a processor and a controller. Also, other processing configurations are possible, such as parallel processors.

Software may include a computer program, code, instructions, or a combination of one or more thereof, or may configure the processing units to operate as desired or command the processing units independently or collectively. Software and/or data may be embodied in any tangible machine, component, physical device, virtual equipment, computer storage medium or device, to be interpreted by or to provide instructions or data to a processing device. Software may be distributed on networked computer systems and stored or executed in a distributed manner. Software and data may be stored on one or more computer readable media.

One or more embodiments of the present disclosure may implement a structure in which a color temperature/dimming control function is added to a single output LED driver in an LED lighting device including a color temperature control and dimming function. One or more embodiments of the present disclosure may be implemented in a structure in which power is supplied to the LED control unit by stepping down the output of the LED driver. One or more embodiments of the present disclosure may include a circuit for generating a pulse width modulation (PWM) signal for controlling a switch without a micro control unit (MCU). In one or more embodiments of the present disclosure, a separate circuit (board) for color temperature control and dimming may be attached to the output terminal of the LED driver in the LED lighting device. In one or more example embodiments of the present disclosure, a color temperature function is provided using a single-channel LED driver, various color temperature (3000K/4000K/5000K) and brightness (100%/75%/50%) may be set with one LED lighting device, it is comprised of parts that are easy to supply and demand without an Micro Control Unit (MCU), and thus, it is possible to respond to semiconductor shortages, the firmware download process may be eliminated during mass production due to the MCU-less circuit design, it is possible to configure a pulse generator and gate driver with a single IC, and thus, parts inventory management is facilitated, system reliability may be improved due to the use of fewer parts and circuit simplification, a low-cost isolated dimming circuit may be configured, the power supply circuit with input voltage detection and bypass function improves heat generation problems, and MCU and LDO IC functions may be implemented by configuring a circuit with general-purpose parts that are easy to supply.

One or more embodiments use existing MCU functions (PWM (Pulse Width Modulation) generation for warm/cool string control, detection of CCT set value, variable duty ratio of Warm/Cool PWM according to detected CCT set value, etc.) as a pulse generator, T-filter and dual gate driver. Embodiments step down the output voltage (e.g., 30 to 48 Vdc) of the LED driver using an LDO to supply the driving voltage (3.3 Vdc) required for the MCU. —less Initiates the LED control circuit.

In an example embodiment, the LED control circuit may include a power supply circuit for generating power for the oscillator and the gate driver by stepping down the output of the LED driver. In an example embodiment, the LED control circuit may include a time delay circuit reaching a trigger level of a logic IC through a T-filter. In an example embodiment, the LED control circuit may be implemented in a structure that blocks or connects the current path by placing a switch between the cathode end of the warm/cool LED string and the ground.

In an example embodiment, the LED control circuit may be implemented in a structure in which the color temperature of the LED module is set by connecting the LED control circuit between the LED driver and the LED module.

One or more embodiments use a single output LED driver to distribute current to a warm/cool string without changing the current value, and the circuit may be configured with discrete parts without GPU (Graphic Processing Unit) and memory. One or more embodiments may replace MCU functions with discrete parts without MCU. Embodiments are not limited to the topology of buck-boost and multi-resonant converters, and may control a switch connected in series to an LED string.

The MCU-less LED control circuit according to an example embodiment may select a color temperature using a single output LED driving device. In an example embodiment, the LED control circuit may be implemented in a structure connected between the LED driving device and the LED module. In an example embodiment, the LED control circuit may be implemented as an integrated LED module including an LED control circuit mounted on the LED module. In an example embodiment, the LED control circuit may be implemented as a structure included inside the LED driving device.

An LED control circuit according to an example embodiment may be implemented as a power supply circuit, a pulse generator, a T-filter, and a gate driver. In an example embodiment, it may be implemented as a power supply structure that generates power for a logic IC by stepping down the output voltage of the LED driving device. In an example embodiment, a pulse generation circuit composed of a resistor, a capacitor, and a Schmitt trigger inverter may be implemented. In an example embodiment, a T-filter capable of controlling the time to reach the +trigger level and the −trigger level of the Schmitt trigger inverter by a resistor and a capacitor may be implemented. In an example embodiment, a structure for supplying or blocking the current supplied to the LED by placing a switch between the cathode end of the LED string and the ground may be implemented.

An LED control circuit according to an example embodiment may be implemented as a power supply circuit, a pulse generator, a low-pass filter, a comparator, and a gate driver. The LED control circuit according to an example embodiment may be implemented as a bypass control circuit that conducts/disconnects a plurality of regulators according to the output voltage of the LED driver. The LED control circuit according to an example embodiment has an isolated structure from the color temperature control circuit and may be implemented as a circuit that varies the reference potential of the dimming terminal of the LED driver.

As set forth above, in an LED control unit according to an example embodiment, a lighting device including the same, and an operating method thereof, the trigger level of the Schmitt trigger inverter may be varied by adjusting the time constant value of the T-filter, and the PWM duty ratio may be adjusted according to the variation of the trigger level.

In an LED control unit according to an example embodiment, a lighting device including the same, and an operating method thereof, the color temperature and dimming of the LED lighting device may be controlled by adjusting the PWM duty ratio.

In an LED control unit according to an example embodiment, a lighting device including the same, and an operating method thereof, isolated circuits may be used to replace an MCU function, and the color temperature/dimming control of the LED may be performed by controlling the PWM duty ratio.

In an LED control unit according to an example embodiment, a lighting device including the same, and an operating method thereof, inexpensive LED control unit with easy parts supply without expensive MCU may be configured, and the firmware downloading process may be omitted during mass production.

While example embodiments have been illustrated and described above, it will be apparent to those skilled in the art that modifications and variations could be made without departing from the scope of the present disclosure as defined by the appended claims.

What is claimed is:

1. A light-emitting diode (LED) control unit comprising:
   a pulse generator configured to generate a pulse signal;
   a T-filter configured to convert the pulse signal into a triangular wave signal;
   a first gate driver configured to receive the triangular wave signal and output a first gate control signal;
   a second gate driver configured to receive the first gate control signal and output a second gate control signal;

a first switch configured to turn on a first LED string corresponding to a first color temperature based on the first gate control signal;

a second switch configured to turn on a second LED string corresponding to a second color temperature based on the second gate control signal; and a power supply circuit configured to supply a power supply voltage to the pulse generator, the first gate driver, and the second gate driver by stepping down an operating voltage of an LED driver.

2. The LED control unit of claim 1, wherein the first color temperature is higher than the second color temperature.

3. The LED control unit of claim 1, wherein the pulse generator comprises:
a first resistor;
a first capacitor connected between a first terminal of the first resistor and a ground terminal; and
a first Schmitt trigger inverter connected to the first terminal of the first resistor and a second terminal of the first resistor.

4. The LED control unit of claim 3, wherein the T-filter comprises:
a second resistor having a first terminal connected to the second terminal of the first resistor;
a third resistor connected to a second terminal of the second resistor; and
a second capacitor connected between the second terminal of the second resistor and the ground terminal.

5. The LED control unit of claim 4, wherein a resistance of the third resistor is varied to control a time to reach a trigger level of the first Schmitt trigger inverter.

6. The LED control unit of claim 3, wherein the T-filter comprises:
a second resistor having a first terminal connected to the second terminal of the first resistor;
a selection switch configured to connect one of a plurality of resistors to a second terminal of the second resistor to control a time to reach a trigger level of the first Schmitt trigger inverter; and
a second capacitor connected between the second terminal of the second resistor and the ground terminal.

7. The LED control unit of claim 3, wherein the first gate driver comprises a second Schmitt trigger inverter configured to receive an output signal of the T-filter and output the first gate control signal, and
the second gate driver comprises a third Schmitt trigger inverter configured to receive the first gate control signal and output the second gate control signal.

8. The LED control unit of claim 1, wherein the first switch is between a first cathode terminal of the first LED string and a ground terminal, and
the second switch is between a second cathode terminal of the second LED string and the ground terminal.

9. The LED control unit of claim 1, wherein the power supply circuit comprises:
a first regulator configured to receive the operating voltage and output a first voltage;
a second regulator configured to receive an output voltage of the first regulator and output the power supply voltage; and
a bypass control circuit configured to determine whether to bypass the first regulator according to a level of the operating voltage.

10. The LED control unit of claim 9, wherein the bypass control circuit is configured to:
activate the first regulator based on the operating voltage being greater than or equal to a reference voltage,
deactivate the first regulator based on the operating voltage being less than the reference voltage, and
input the operating voltage to the second regulator.

11. A lighting device comprising:
a light-emitting diode (LED) module configured to:
receive an operating voltage, and
output light of different color temperatures;
an LED control unit configured to:
receive the operating voltage, and
control color temperature or dimming of the LED module; and
an LED driver configured to:
receive AC power, and
provide the operating voltage to the LED module and the LED control unit,
wherein the LED control unit comprises a power supply circuit, the power supply circuit comprising a first regulator and a second regulator, the operating voltage being an input to the first regulator and the second regulator, and the power supply circuit being configured to distribute a power lost as heat between the first regulator and the second regulator.

12. The lighting device of claim 11, wherein the LED module comprises:
a first LED string configured to output light of a first color temperature; and
a second LED string configured to output light of a second color temperature that is lower than the first color temperature.

13. The lighting device of claim 11, wherein the LED control unit comprises:
a pulse generator configured to:
receive the operating voltage, and
output a pulse signal;
a T-filter configured to:
receive the pulse signal, and
output a triangular wave signal;
at least one gate driver configured to:
receive the triangular wave signal, and
output a gate control signal; and
at least one switch configured to:
receive the gate control signal, and
switch the LED module.

14. The lighting device of claim 11, wherein the LED control unit comprises:
a pulse generator configured to:
receive the operating voltage, and
output a pulse signal;
a low-pass filter configured to:
receive the pulse signal, and
convert the pulse signal into a DC voltage in a form of a triangular wave;
a comparator configured to compare an output voltage of the low-pass filter with a reference voltage;
at least one gate driver configured to:
receive an output signal of the comparator, and
output a gate control signal having a duty ratio according to the reference voltage; and
at least one switch configured to:
receive the gate control signal, and
switch the LED module.

15. The lighting device of claim 14, wherein the comparator comprises:
an operational amplifier;
a resistor connected between a non-inverting terminal of the operational amplifier and an output terminal of the operational amplifier; and a selection switch configured to determine the duty ratio by connecting one of a plurality of resistors between an inverting terminal of the operational amplifier and a ground terminal.

16. A method of operating a light-emitting diode (LED) control unit, the method comprising:
   receiving an operating voltage from an LED driver;
   generating a power supply voltage from the operating voltage using a first regulator and a second regulator;
   distributing a power lost as heat between the first regulator and the second regulator;
   adjusting a pulse width modulation (PWM) duty ratio through control of a selection switch; and
   controlling a color temperature or a dimming of an LED module according to the PWM duty ratio,
   wherein the controlling of the color temperature or the dimming comprises:
      turning on a first LED string corresponding to a first color temperature in response to a first gate control signal having the PWM duty ratio; and
      turning on a second LED string corresponding to a second color temperature lower than the first color temperature in response to a second gate control signal having the PWM duty ratio.

17. The method of claim 16, further comprising:
   generating a pulse signal using a Schmitt trigger inverter based on a time constant value corresponding to a resistor and a capacitor; and
   converting the pulse signal into a triangular wave signal.

18. The method of claim 17, wherein the adjusting of the PWM duty ratio comprises controlling a time to reach a trigger level of the Schmitt trigger inverter.

19. The method of claim 18, wherein the adjusting of the PWM duty ratio further comprises varying the time constant value, wherein the time constant value is associated with a T-filter, and the time constant value determines a slope of the triangular wave signal.

* * * * *